(12) United States Patent
Kinoshita et al.

(10) Patent No.: US 7,919,227 B2
(45) Date of Patent: Apr. 5, 2011

(54) POSITIVE RESIST COMPOSITION AND METHOD OF FORMING RESIST PATTERN

(75) Inventors: Yohei Kinoshita, Kawasaki (JP); Takeshi Iwai, Kawasaki (JP); Toshiyuki Ogata, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 229 days.

(21) Appl. No.: 12/440,447

(22) PCT Filed: Aug. 7, 2007

(86) PCT No.: PCT/JP2007/065445
§ 371 (c)(1),
(2), (4) Date: Mar. 6, 2009

(87) PCT Pub. No.: WO2008/032512
PCT Pub. Date: Mar. 20, 2008

(65) Prior Publication Data
US 2010/0040970 A1    Feb. 18, 2010

(30) Foreign Application Priority Data

Sep. 11, 2006  (JP) .................................. 2006-246130

(51) Int. Cl.
*G03F 7/004* (2006.01)
*G03F 7/30* (2006.01)
(52) U.S. Cl. ..................... 430/270.1; 430/326; 430/910
(58) Field of Classification Search ............... 430/270.1, 430/326, 910
See application file for complete search history.

(56) References Cited

U.S. PATENT DOCUMENTS

| | | | | |
|---|---|---|---|---|
| 5,688,628 | A * | 11/1997 | Oie et al. ..................... | 430/176 |
| 5,945,517 | A | 8/1999 | Nitta et al. | |
| 6,153,733 | A | 11/2000 | Yukawa et al. | |
| 7,323,287 | B2 | 1/2008 | Iwai et al. | |
| 7,645,559 | B2 * | 1/2010 | Watanabe et al. .......... | 430/270.1 |
| 7,781,144 | B2 * | 8/2010 | Kinoshita et al. .......... | 430/270.1 |
| 7,803,512 | B2 * | 9/2010 | Kinoshita et al. .......... | 430/270.1 |
| 2010/0081088 | A1 * | 4/2010 | Kawaue et al. .............. | 430/285.1 |

FOREIGN PATENT DOCUMENTS

| | | |
|---|---|---|
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2002-220059 | 8/2002 |
| JP | 2003-241385 | 8/2003 |
| JP | 2004-046098 | 2/2004 |
| JP | 2005-043852 | 2/2005 |
| WO | WO 2004-074242 | 9/2004 |

OTHER PUBLICATIONS

International Search Report issued for corresponding PCT Application No. PCT/JP2007/065445, dated Sep. 11, 2007.

* cited by examiner

*Primary Examiner* — John S Chu
(74) *Attorney, Agent, or Firm* — Knobbe, Martens, Olson & Bear, LLP

(57) ABSTRACT

A positive resist composition including a resin component (A) which exhibits increased alkali solubility under action of acid and an acid-generator component (B) which generates acid upon exposure,
   the resin component (A) including a structural unit (a1) represented by general formula (I) shown below:
   wherein R represents a hydrogen atom, a halogen atom, a lower alkyl group or a halogenated lower alkyl group; $R^{1'}$ represents a hydrogen atom or a lower alkyl group; n represents an integer of 0 to 3; $R^1$ represents a lower alkyl group, a fluorine atom, or a fluorinated lower alkyl group; and p represents an integer of 0 to 2.

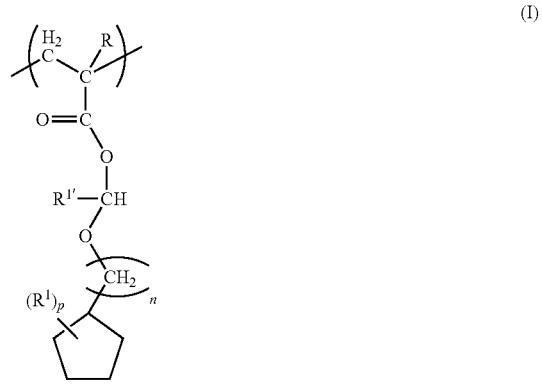

(I)

6 Claims, No Drawings

POSITIVE RESIST COMPOSITION AND METHOD OF FORMING RESIST PATTERN

RELATED APPLICATIONS

This application is the U.S. National Phase filing under 35 U.S.C. §371 of PCT/JP2007/065445, filed Aug. 7, 2007, which designated the United States and was published in a language other than English, which claims priority under 35 U.S.C. §119(a)-(d) to Japanese Patent Application No. 2006-246130, filed Sep. 11, 2006. The contents of these applications are incorporated herein by reference in their entireties.

TECHNICAL FIELD

The present invention relates to a positive resist composition and a method of forming a resist pattern.

BACKGROUND ART

In lithography techniques, for example, a resist film composed of a resist material is formed on a substrate, and the resist film is subjected to selective exposure of radial rays such as light or electron beams through a mask having a predetermined pattern, followed by development, thereby forming a resist pattern having a predetermined shape on the resist film. A resist material in which the exposed portions become soluble in a developing solution is called a positive-type resist material, and a resist material in which the exposed portions become insoluble in a developing solution is called a negative-type resist material.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are now starting to be introduced in mass production of semiconductor elements. Furthermore, research is also being conducted into lithography techniques that use exposure light source having a wavelength shorter than these excimer lasers, such as $F_2$ excimer lasers, electron beam, extreme ultraviolet radiation (EUV), and X ray.

Resist materials for use with these types of exposure light sources require lithography properties such as a resolution capable of reproducing patterns of minute dimensions, and a sensitivity to these types of exposure light sources. One example of a resist material capable of satisfying these requirements is a chemically amplified resist (also referred to as a chemically amplified resist composition), which includes a base resin that displays changed alkali solubility under the action of acid, and an acid generator that generates acid upon exposure. For example, a chemically amplified positive resist contains, as a base resin, a resin which exhibits increased alkali solubility under action of acid, and an acid generator. In the formation of a resist pattern, when acid is generated from the acid generator upon exposure, the exposed portions become alkali soluble.

Until recently, polyhydroxystyrene (PHS) or derivative resins thereof in which the hydroxyl groups have been protected with acid-dissociable, dissolution-inhibiting groups (PHS-based resins), which exhibit high transparency relative to a KrF excimer laser (248 nm), have been used as the base resin of chemically amplified resists. However, because PHS-based resins contain aromatic rings such as benzene rings, their transparency is inadequate for light with wavelengths shorter than 248 nm, such as light of 193 nm. Accordingly, chemically amplified resists that use a PHS-based resin as the base resin component suffer from low levels of resolution in processes that use light of 193 nm.

As a result, resins that contain structural units derived from (meth)acrylate esters within the principal chain (acrylic resins) are now widely used as the base resins for resists (also referred to as resist compositions) that use ArF excimer laser lithography or the like, as they offer excellent transparency in the vicinity of 193 nm (see Patent Document 1).

[Patent Document 1] Japanese Unexamined Patent Application, First Publication No. 2003-241385

DISCLOSURE OF INVENTION

Problems to be Solved by the Invention

However, when a conventional resist composition is used to form a resist pattern, problems were caused in some cases such as roughness on the side wall surfaces of the pattern.

When the roughness is, for example, roughness on the side wall surfaces of a line pattern (so-called line edge roughness (LER)), it can cause fluctuations in the line width and thus, has the potential to adversely affect the formation of very fine semiconductor elements.

As a result, in a situation where the miniaturization of resist patterns progress, reduction of LER is becoming more and more important as the demand for resist patterns with higher resolution is increasing.

The present invention takes the above circumstances into consideration, with an object of providing a positive resist composition which is capable of forming a resist pattern with a reduced level of LER, and a method of forming a resist pattern.

Means for Solving the Problems

As a result of extensive and intensive studies, present inventors have found that the aforementioned problems can be solved by using a resin component having a structural unit containing an acetal-type acid dissociable, dissolution inhibiting group that contains a cyclopentyl group, as a base resin. The present invention has been completed, based on this finding.

Specifically, a first aspect of the present invention is a positive resist composition including a resin component (A) which exhibits increased alkali solubility under action of acid and an acid-generator component (B) which generates acid upon exposure, wherein the resin component (A) includes a structural unit (a1) represented by the general formula (I) shown below.

[Chemical Formula 1]

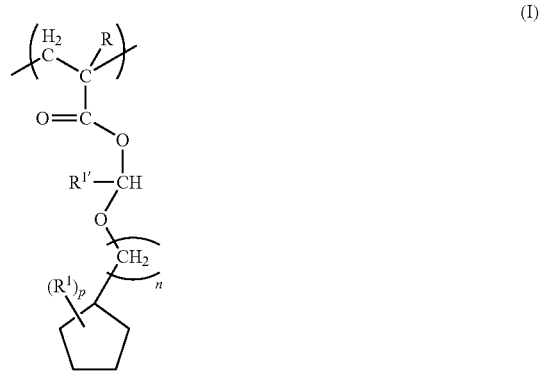

wherein R represents a hydrogen atom, a halogen atom, a lower alkyl group or a halogenated lower alkyl group; $R^{1'}$ represents a hydrogen atom or a lower alkyl group; n represents an integer of 0 to 3; $R^1$ represents a lower alkyl group, a fluorine atom, or a fluorinated lower alkyl group; and p represents an integer of 0 to 2.

Further, a second aspect of the present invention is a method of forming a resist pattern, including: applying a positive resist composition of the first aspect to a substrate to form a resist film on the substrate; subjecting the resist film to exposure; and developing the resist film to form a resist pattern.

In the present description and claims, the term "structural unit" refers to a monomer unit that contributes to the formation of a resin component (polymer).

An "alkyl group" includes linear, branched or cyclic, monovalent saturated hydrocarbon, unless otherwise specified.

An "alkylene group" includes linear, branched or cyclic, divalent saturated hydrocarbon, unless otherwise specified.

A "lower alkyl group" refers to an alkyl group of 1 to 5 carbon atoms.

A "halogenated lower alkyl group" is a group in which a part or all of the hydrogen atoms of the abovementioned lower alkyl group is substituted with halogen atoms.

The term "exposure" is used as a general concept that includes irradiation with any form of radiation.

EFFECTS OF THE INVENTION

According to the present invention, there are provided a positive resist composition which is capable of forming a resist pattern with a reduced level of LER, and a method of forming a resist pattern.

BEST MODE FOR CARRYING OUT THE INVENTION

Positive Resist Composition

The positive resist composition of the present invention includes a resin component (A) (hereafter, frequently referred to as "component (A)") which exhibits increased alkali solubility under action of acid and an acid-generator component (B) (hereafter, frequently referred to as "component (B)") which generates acid upon exposure.

In the positive resist composition, the component (A) is alkali insoluble prior to exposure, and when acid is generated from the component (B) upon exposure, the generated acid acts on the component (A) to increase the alkali solubility thereof. Therefore, in the formation of a resist pattern, by conducting selective exposure of a resist film formed by applying the positive resist composition onto a substrate, the exposed portions become alkali soluble, whereas the unexposed portions remain alkali insoluble, and hence, a resist pattern can be formed by alkali developing.
<Component (A)>

In the present invention, the component (A) includes a structural unit (a1) represented by the general formula (I) above.

In addition, the component (A) includes a structural unit (a2) derived from an acrylate ester having a lactone-containing cyclic group, as well as the structural unit (a1).

Moreover, the component (A) preferably includes a structural unit (a3) derived from an acrylate ester containing a polar group-containing aliphatic hydrocarbon group, as well as the structural unit (a1). Furthermore, the component (A) preferably includes a structural unit (a3) derived from an acrylate ester containing a polar group-containing aliphatic hydrocarbon group, as well as the structural unit (a1) and the structural unit (a2).

In the present descriptions and claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent which may be bonded to the carbon atom on the α-position (substituent at the α-position), a halogen atom, a lower alkyl group or a halogenated lower alkyl group can be exemplified. Examples of the halogen atom include a fluorine atom, a chlorine atom, a bromine atom and an iodine atom, and a fluorine atom is particularly desirable.

With respect to the "structural unit derived from an acrylate ester", the "α-position (the carbon atom on the α-position)" refers to the carbon atom having the carbonyl group bonded thereto, unless specified otherwise.

Examples of the lower alkyl group for the substituent at the α-position within an acrylate ester include linear or branched lower alkyl groups such as a methyl group, an ethyl group, a propyl group, an isopropyl group, an n-butyl group, an isobutyl group, a tert-butyl group, a pentyl group, an isopentyl group, and a neopentyl group.

Examples of the halogenated lower alkyl group for the substituent at the α-position include groups in which a part or all of the hydrogen atoms of the aforementioned "lower alkyl group for the substituent at the α-position" are substituted with halogen atoms. Examples of the above halogen atoms include fluorine atoms, chlorine atoms, bromine atoms and iodine atoms, and fluorine atoms are particularly desirable.

In the present invention, it is preferable that a hydrogen atom, a halogen atom, a lower alkyl group or a halogenated lower alkyl group be bonded to the α-position of the acrylate ester, more preferably a hydrogen atom, a fluorine atom, a lower alkyl group or a fluorinated lower alkyl group. In terms of industrial availability, a hydrogen atom or a methyl group is particularly preferable, and a methyl group is most preferable.

Structural Unit (a1)

The structural unit (a1) is a structural unit represented by the general formula (I) above. By having the structural unit (a1), a resist pattern with a reduced level of LER can be formed.

In the general formula (I), R represents a hydrogen atom, a halogen atom, a lower alkyl group or a halogenated lower alkyl group. The halogen atom, the lower alkyl group and the halogenated lower alkyl group for R are the same as the halogen atom, the lower alkyl group and the halogenated lower alkyl group which may be bonded to the α-position of the aforementioned acrylate ester. Of these, a hydrogen atom or a methyl group is particularly preferable, and a methyl group is most preferable.

$R^{1'}$ represents a hydrogen atom or a lower alkyl group. As the lower alkyl group for $R^{1'}$, the same as the lower alkyl groups for R above can be exemplified. As the lower alkyl group for $R^{1'}$, a methyl group or an ethyl group is preferable, and a methyl group is particularly desirable.

Of these, in the present invention, it is more preferable that $R^{1'}$ be a hydrogen atom.

n is an integer of 0 to 3, preferably 0 to 2, more preferably 0 or 1, and most preferably 0.

$R^1$ represents a lower alkyl group, a fluorine atom, or a fluorinated lower alkyl group. As the lower alkyl group for $R^1$, the same as the lower alkyl groups for R above can be exemplified. The fluorinated lower alkyl group for $R^1$ is a group in which some or all of the hydrogen atoms of the aforementioned lower alkyl group have been substituted with fluorine atoms.

p represents an integer of 0 to 2, preferably 0 or 1, and particularly preferably 0 from an industrial point of view.

If p is 1, the substitution position of $R^1$ may be any substitution positions, and if p is 2, any combination of the substitution positions is suitable.

Specific examples of structural units represented by the above general formula (I) are shown below.

[Chemical Formula 2]

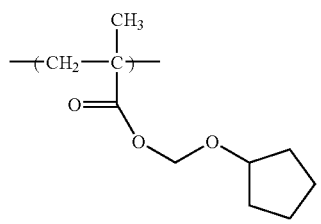
(a1-2-24)

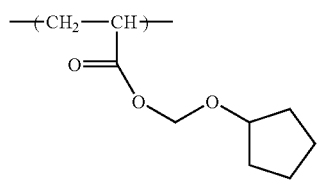
(a1-2-25)

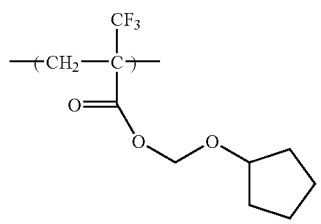
(a1-2-30)

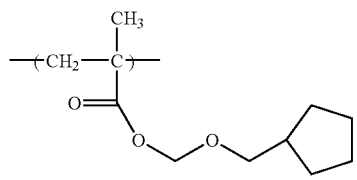
(a1-2-35)

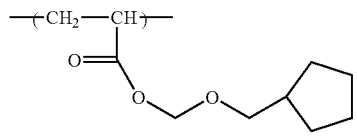
(a1-2-36)

Of these, it is more preferable to use at least one structural unit selected from the structural units represented by the chemical formulae (a1-2-24), (a1-2-25), (a1-2-35), and (a1-2-36), and it is most preferable to use the structural unit represented by the chemical formula (a1-2-24).

Monomers that give rise to the structural unit (a1) can be synthesized, for example, by reacting a compound represented by the general formula (1) shown below with a compound represented by the general formula (2) shown below.

[Chemical Formula 3]

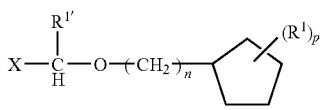
(1)

wherein $R^{1'}$, $R^1$, n and p are respectively as defined for $R^{1'}$, $R^1$, n and p in the general formula (I) above, and X represents a halogen atom.

[Chemical Formula 4]

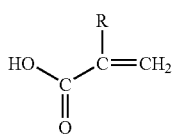
(2)

wherein R represents a hydrogen atom, a halogen atom, a lower alkyl group or a halogenated lower alkyl group.

In the general formula (1) above, $R^{1'}$, $R^1$, n and p are respectively as defined for $R^{1'}$, $R^1$, n and p in the general formula (I) above.

X represents a halogen atom. Among the halogen atoms, as X, a chlorine atom or a bromine atom is particularly desirable.

Specific examples of compounds represented by the general formula (1) include chloromethoxycyclopentane and bromomethoxycyclopentane.

In the general formula (2) above, R represents a hydrogen atom, a halogen atom, a lower alkyl group or a halogenated lower alkyl group. R is as defined for R in the general formula (I) above.

Specific examples of compounds represented by the general formula (2) include acrylic acid, methacrylic acid, and trifluoromethylacrylic acid.

In the method for producing monomers that give rise to the structural unit (a1), the compound represented by the general formula (2) is usually used at 0.8 to 5 times the number of moles, and preferably 1.0 to 2.0 times the number of moles, based on the compound represented by the general formula (1).

The reaction temperature is usually within a range of from −200 to 200° C., and preferably within a range of from −50 to 100° C.

The reaction pressure is usually within a range of from 0.01 to 10 MPa in absolute pressure, and preferably within a range of from normal pressure to 1 MPa.

When the reaction pressure is too low, the solubility of the generated hydrogen halide gas in a solvent or the like decreases which results in a longer reaction time.

On the other hand, when the reaction pressure is too high, it is not economical since a special apparatus will be required.

Solvents can be used in the reaction, if necessary, and examples of the solvents include hydrocarbon based solvents such as hexane, heptane, and octane; aromatic hydrocarbon based solvents such as benzene, toluene, and xylene; ether based solvents such as diethyl ether, diisopropyl ether, and tetrahydrofuran; halogen based solvents such as dichloromethane, chloroform, and carbon tetrachloride; acetone, acetonitrile, N,N-dimethylformamide, and dimethyl sulfoxide.

The reaction can be carried out in the presence of a basic substance, if necessary.

Examples of the basic substance include trimethylamine, triethylamine, tributylamine, trioctylamine, pyridine, lithium carbonate, potassium carbonate, and sodium carbonate.

The used amount of the basic substance is usually within a range of from 1 to 5 moles, preferably within a range of from 1 to 2 moles, per 1 mole of the compound represented by the general formula (2).

After the completion of the reaction, a reaction product is usually washed using an aqueous solution of a basic compound for removing unreacted portions of the compound represented by the general formula (2).

As the basic compound, commonly used basic compounds can be used, and among them, inorganic basic compounds are preferable.

Specific examples thereof include sodium bicarbonate, sodium carbonate, potassium bicarbonate, potassium carbonate, sodium dihydrogen phosphate, disodium hydrogen phosphate, sodium phosphate, potassium dihydrogen phosphate, dipotassium hydrogen phosphate, potassium phosphate, sodium hydroxide, and potassium hydroxide.

As the basic compound, organic basic compounds such as trimethylamine, triethylamine, tributylamine, trioctylamine, and pyridine can also be used. However, compared to inorganic basic compounds, organic basic compounds are difficult to remove by washing with water, and thus may remain in the monomers that give rise to the structural unit (a1) and may adversely affect the storage stability of the compound.

The monomers that give rise to the structural unit (a1) can be obtained by washing a reaction product using an aqueous solution of a basic compound, and thereafter conducting a common post treatment followed by the evaporation of solvents under reduced pressure.

The monomers obtained in this manner that give rise to the structural unit (a1) can be made into finished products as they are, or can be subjected to further purification processes such as distillation and crystallization, depending on the properties of the obtained monomers that give rise to the structural unit (a1) and the types of impurities contained therein.

The compound represented by the general formula (1) can be produced, for example, by reacting cyclopentyl alcohol (cyclopentanol) with formaldehyde or paraformaldehyde and hydrogen chloride gas or hydrogen bromide gas in an organic solvent.

The reaction temperature is usually within a range of from −200 to 200° C., and preferably within a range of from −50 to 100° C.

The reaction pressure is usually within a range of from 0.01 to 10 MPa in absolute pressure, and preferably within a range of from normal pressure to 1 MPa.

When the reaction pressure is too low, the solubility of the hydrogen chloride gas or hydrogen bromide gas used in the reaction in a solvent or the like decreases which results in a longer reaction time.

On the other hand, when the reaction pressure is too high, it is not economical since a special apparatus will be required.

As an organic solvent, those in which water dissolves with a solubility of 5% by weight or less at a reaction temperature are usually used.

Specific examples of the organic solvent include hydrocarbon-based solvents such as hexane and heptane; ether-based solvents such as diethyl ether and dibutyl ether; and halogen-based solvents such as dichloromethane and carbon tetrachloride.

After the completion of the reaction, the water and the organic layer produced by the reaction are separated.

Unreacted portions of formaldehyde or paraformaldehyde are transferred to an aqueous layer and will be removed.

The compound represented by the general formula (1) can be obtained by evaporating solvents from the obtained reaction product under reduced pressure.

The obtained compound represented by the general formula (1) can be used as it is for producing the monomers that give rise to the structural unit (a1), or can be subjected to further purification processes such as distillation and crystallization, if necessary, and then used for producing the monomers that give rise to the structural unit (a1).

As the structural unit (a1) in the component (A), one type of structural unit may be used alone, or two or more types of structural units may be used in combination.

The amount of the structural unit (a1) within the component (A) based on the combined total of all structural units constituting the component (A) is preferably 10 to 80 mol %, more preferably 20 to 70 mol %, and still more preferably 25 to 50 mol %. By making the amount of the structural unit (a1) at least as large as the lower limit of the above-mentioned range, the effect of using the structural unit (a1) can be satisfactorily achieved. On the other hand, by making the amount of the structural unit (a1) no more than the upper limit of the above-mentioned range, a good balance can be achieved with the other structural units.

Structural Unit (a2)

In the present invention, it is preferable that the component (A) further include a structural unit (a2) derived from an acrylate ester having a lactone-containing cyclic group.

The term "lactone-containing cyclic group" refers to a cyclic group including one ring containing a —O—C(O)— structure (lactone ring), and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 5]

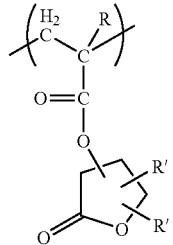

(a2-1)

-continued (a2-2)
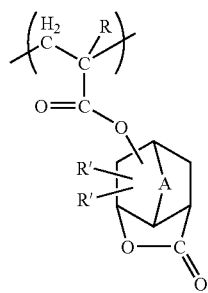

(a2-3)
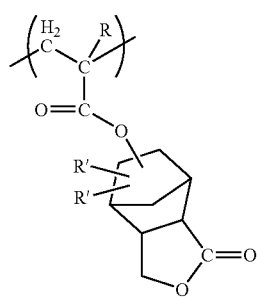

(a2-4)
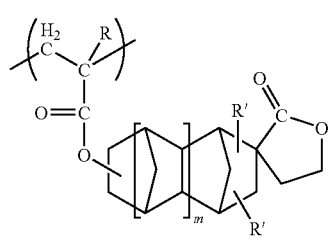

(a2-5)
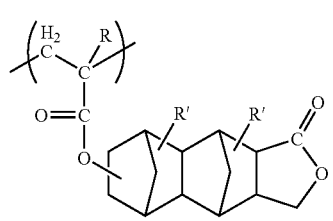

wherein R represents a hydrogen atom, a halogen atom, a lower alkyl group or a halogenated lower alkyl group; R' represents a hydrogen atom, a lower alkyl group or an alkoxy group of 1 to 5 carbon atoms; m represents an integer of 0 or 1; and A represents an alkylene group of 1 to 5 carbon atoms or an oxygen atom.

In general formulas (a2-1) to (a2-5), R is the same as R in general formula (I) for the structural unit (a1) above.

The lower alkyl group for R' is the same as the lower alkyl group for R in general formula (I) for the structural unit (a1) above.

In the structural units represented by general formulas (a2-1) to (a2-5), in consideration of industrial availability, R' is preferably a hydrogen atom.

Specific examples of the alkylene group of 1 to 5 carbon atoms for A include methylene group, ethylene group, n-propylene group, and isopropylene group.

Specific examples of structural units represented by general formulas (a2-1) to (a2-5) above are shown below.

[Chemical Formula 6]

(a2-1-1)
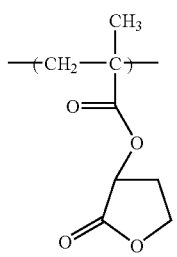

(a2-1-2)
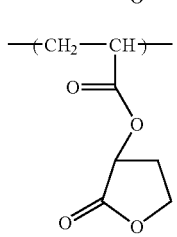

(a2-1-3)
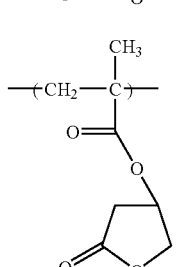

(a2-1-4)
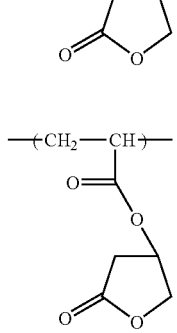

(a2-1-5)
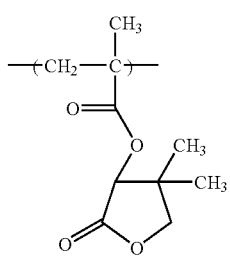

(a2-1-6)
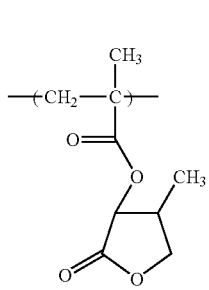

[Chemical Formula 7]
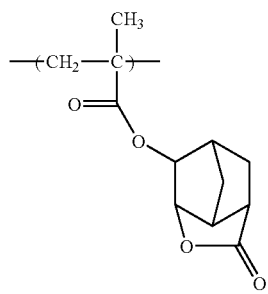 (a2-2-1)
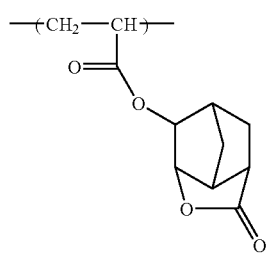 (a2-2-2)
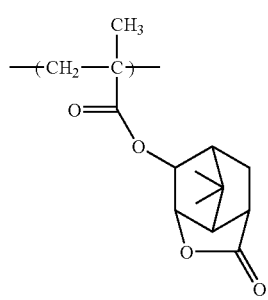 (a2-2-3)
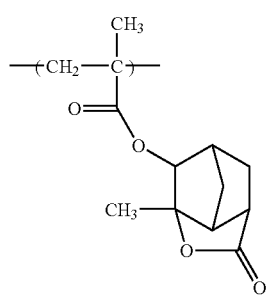 (a2-2-4)
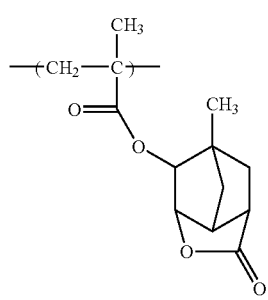 (a2-2-5)
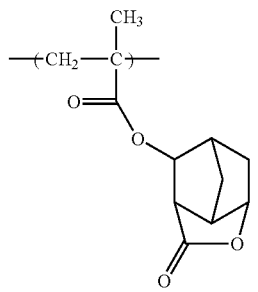 (a2-2-6)
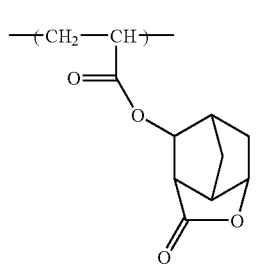 (a2-2-7)
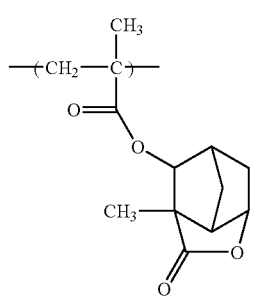 (a2-2-8)
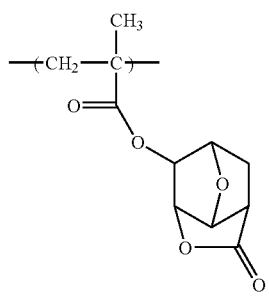 (a2-2-9)
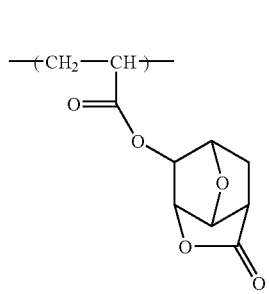 (a2-2-10)

[Chemical Formula 8]
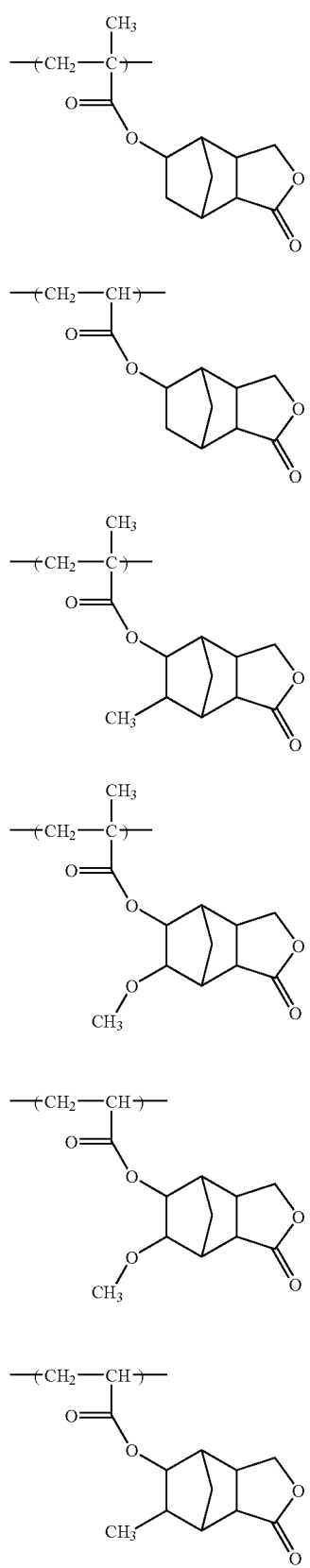
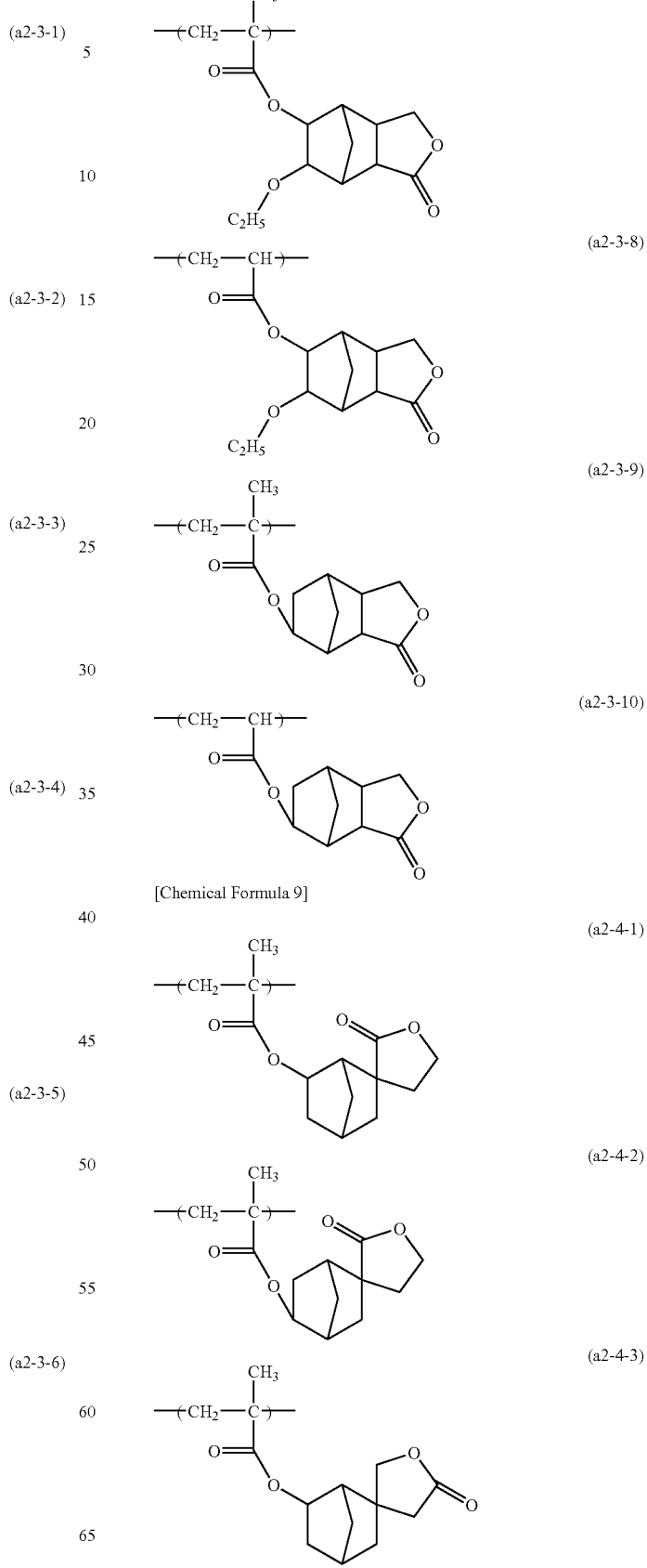

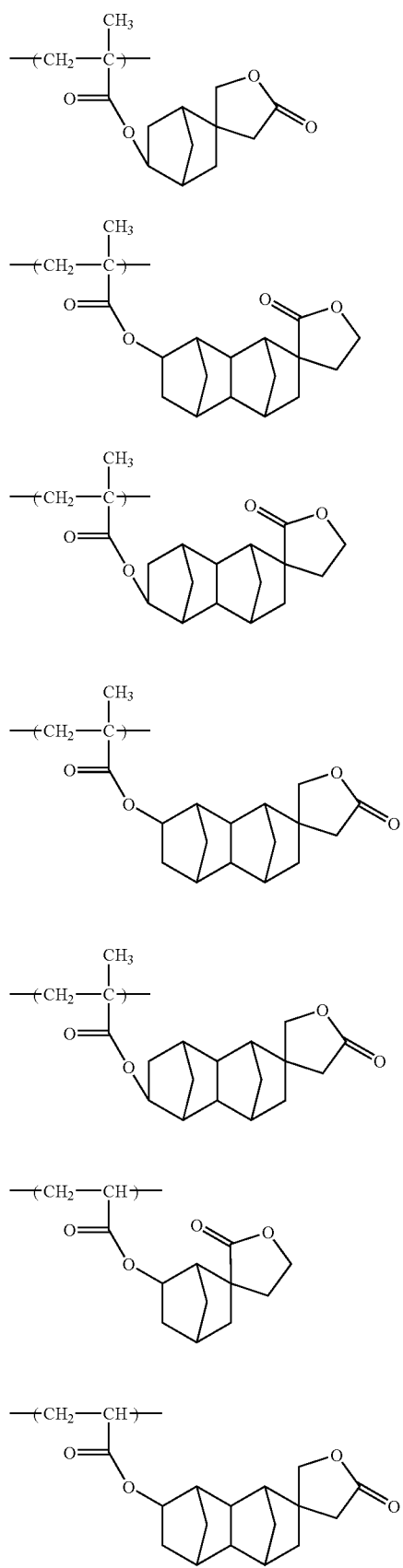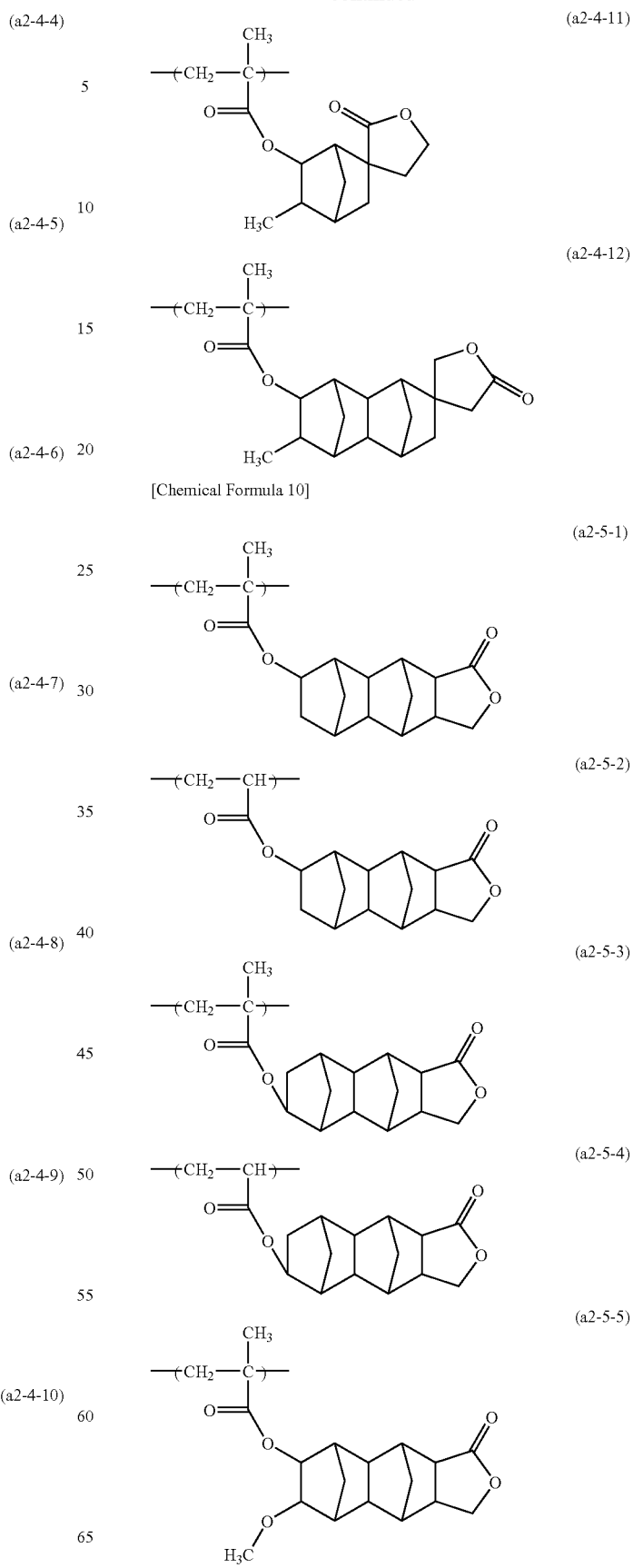

-continued

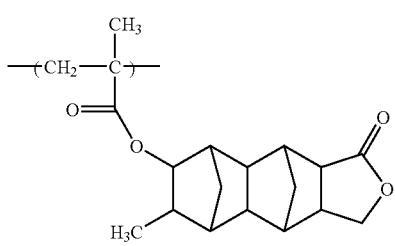

(a2-5-6)

Of these, at least one structural unit selected from the group consisting of structural units represented by general formulas (a2-1) to (a2-5) is preferable, more preferably at least one structural unit selected from the group consisting of structural units represented by general formulas (a2-1) to (a2-3). Specifically, it is particularly preferable to use at least one structural unit selected from the group consisting of formulas (a2-1-1), (a2-1-2), (a2-2-1), (a2-2-2), (a2-3-1), (a2-3-2), (a2-3-9) and (a2-3-10).

In the component (A), as the structural unit (a2), one type of structural unit may be used alone, or two or more types may be used in combination.

The amount of the structural unit (a2) within the component (A) based on the combined total of all structural units constituting the component (A) is preferably 5 to 60 mol %, more preferably 10 to 50 mol %, and still more preferably 20 to 50 mol %. By making the amount of the structural unit (a2) at least as large as the lower limit of the above-mentioned range, the effect of using the structural unit (a2) can be satisfactorily achieved. On the other hand, by making the amount of the structural unit (a2) no more than the upper limit of the above-mentioned range, a good balance can be achieved with the other structural units.

Structural Unit (a3)

In the present invention, it is preferable that the component (A) further include a structural unit (a3) derived from an acrylate ester having a polar group-containing aliphatic hydrocarbon group.

The inclusion of the structural unit (a3) enhances the hydrophilicity of the component (A) and improves the compatibility of the component (A) with the developing solution. As a result, the alkali solubility of the exposed portions improves, which contributes to favorable improvements in the resolution.

Examples of the polar group include a hydroxyl group, a cyano group, a carboxyl group (a carboxy group), or a hydroxyalkyl group in which a part of the hydrogen atoms of the alkyl group have been substituted with fluorine atoms (i.e., fluorinated alkylalcohol), and a hydroxyl group is particularly preferable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers.

Of the various possibilities, structural units derived from an acrylate ester that include an aliphatic polycyclic group that contains a hydroxyl group, a cyano group, a carboxyl group (a carboxy group) or a hydroxyalkyl group in which a part of the hydrogen atoms of the alkyl group have been substituted with fluorine atoms are particularly desirable. Examples of the polycyclic groups include groups in which one or more hydrogen atoms have been removed from a bicycloalkane, tricycloalkane, tetracycloalkane or the like. Specific examples include groups in which one or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by general formulas (a3-1), (a3-2), and (a3-3) shown below are preferable.

[Chemical Formula 11]

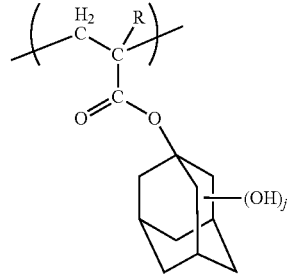

(a3-1)

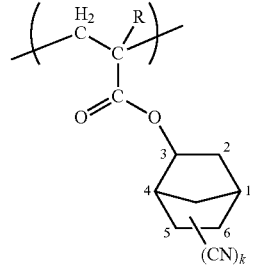

(a3-2)

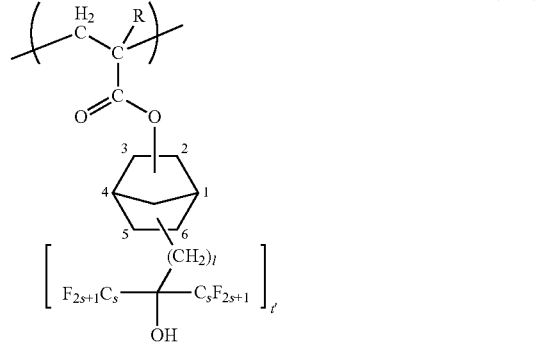

(a3-3)

wherein R represents a hydrogen atom, a halogen atom, a lower alkyl group or a halogenated lower alkyl group; j is an integer of 1 to 3; k is an integer of 1 to 3; t' is an integer of 1 to 3; 1 is an integer of 1 to 5; and s is an integer of 1 to 3.

In general formulas (a3-1) to (a3-3), the halogen atom, lower alkyl group and halogenated lower alkyl group for R are the same as the halogen atom, lower alkyl group and halogenated lower alkyl group which can be bonded to the α-position of the aforementioned acrylate ester.

In general formula (a3-1), j is preferably 1 or 2, and more preferably 1. When j is 2, it is preferable that the hydroxyl groups be bonded to the 3rd and 5th position of the adamantyl group. When j is 1, it is preferable that the hydroxyl group be bonded to the 3rd position of the adamantyl group.

j is preferably 1 and it is particularly desirable that the hydroxyl group be bonded to the 3rd position of the adamantyl group.

In general formula (a3-2), k is preferably 1. The cyano group is preferably bonded to the 5th or 6th position of the norbonyl group.

In general formula (a3-3), t' is preferably 1, l is preferably 1, and s is preferably 1. Further, it is preferable that a 2-norbonyl group or 3-norbonyl group be bonded to the terminal of the carboxy group of the acrylic acid. The fluorinated alkylalcohol (hydroxyalkyl group in which a part of the hydrogen atoms of the alkyl group have been substituted with fluorine atoms) is preferably bonded to the 5th or 6th position of the norbonyl group.

In the component (A), as the structural unit (a3), one type of structural unit may be used alone, or two or more types of structural units may be used in combination.

The amount of the structural unit (a3) within the component (A) based on the combined total of all structural units constituting the component (A) is preferably 5 to 50 mol %, more preferably 5 to 40 mol %, and still more preferably 5 to 25 mol %. By making the amount of the structural unit (a3) at least as large as the lower limit of the above-mentioned range, the effect of using the structural unit (a3) can be satisfactorily achieved. On the other hand, by making the amount of the structural unit (a3) no more than the upper limit of the above-mentioned range, a good balance can be achieved with the other structural units.

(Other Structural Units)

The component (A) may also have an additional structural unit other than the above-mentioned structural units (a1) to (a3), as long as the effects of the present invention are not impaired.

As the additional structural unit, any structural unit which cannot be classified as one of the above structural units (a1) to (a3) can be used without any particular limitations, and any of the multitude of conventional structural units used within resist resins for ArF excimer lasers or KrF excimer lasers (and particularly for ArF excimer lasers) can be used.

Specific examples of the additional structural unit include a structural unit (a1') derived from an acrylate ester having an acid dissociable, dissolution inhibiting group and a structural unit (a4) derived from an acrylate ester containing a non-acid dissociable, aliphatic polycyclic group.

Structural Unit (a1')

In the present invention, the component (A) may further include a structural unit (a1') derived from an acrylate ester having an acid dissociable, dissolution inhibiting group, but excluding the same structural unit as the structural unit (a1) represented by the general formula (I) above.

As the acid dissociable, dissolution inhibiting group in the structural unit (a1'), any of the groups that have been proposed as acid dissociable, dissolution inhibiting groups for the base resins of chemically amplified resists can be used, provided the group has an alkali dissolution-inhibiting effect that renders the entire component (A) alkali insoluble prior to dissociation, and then following dissociation, renders the entire component (A) alkali soluble.

Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known. The term "(meth)acrylate ester" is a generic term that includes either or both of the acrylate ester having a hydrogen atom bonded to the α-position and the methacrylate ester having a methyl group bonded to the α-position.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

In the present description and claims, the term "aliphatic" is a relative concept used in relation to the term "aromatic", and defines a group or compound that has no aromaticity.

The term "aliphatic branched" refers to a branched structure having no aromaticity. The "aliphatic branched, acid dissociable, dissolution inhibiting group" is not limited to be constituted of only carbon and hydrogen (not limited to hydrocarbon groups), but is preferably a hydrocarbon group. Further, the "hydrocarbon group" may be either saturated or unsaturated, but is preferably saturated.

Examples of aliphatic branched, acid dissociable, dissolution inhibiting groups include tertiary alkyl groups of 4 to 8 carbon atoms, and specific examples include a tert-butyl group, tert-amyl group and tert-heptyl group.

The term "aliphatic cyclic group" refers to a monocyclic group or polycyclic group that has no aromaticity.

The "aliphatic cyclic group" within the structural unit (a1') may or may not have a substituent. Examples of substituents include a lower alkyl group of 1 to 5 carbon atoms, a fluorine atom, a fluorinated lower alkyl group of 1 to 5 carbon atoms which is substituted by a fluorine atom, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" is preferably a polycyclic group. The number of carbon atoms within the aliphatic cyclic group is preferably within a range of from 6 to 20, and is more preferably from 7 to 15.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group, may be exemplified. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the alkyl group can be mentioned. Specific examples include a 2-methyl-2-adamantyl group and a 2-ethyl-2-adamantyl group. Further, groups having an aliphatic cyclic group such as an adamantyl group, and a branched alkylene group having a tertiary carbon atom bonded thereto, as in the group bonded to the oxygen atom of the carbonyloxy group (—C(O)—O—) in the structural units represented by general formula (a1″) shown below, can be exemplified.

[Chemical Formula 12]

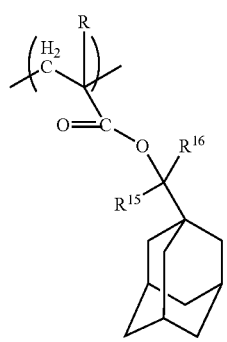

(a1″)

wherein R is as defined for R in general formula (I) above, and each of $R^{15}$ and $R^{16}$ represents an alkyl group (which may be either linear or branched, and preferably has 1 to 5 carbon atoms).

An "acetal-type acid dissociable, dissolution inhibiting group" generally substitutes a hydrogen atom at the terminal of an alkali-soluble group such as a carboxy group or a hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Preferable examples of acetal-type acid dissociable, dissolution inhibiting groups include groups represented by general formula (p1-1) shown below.

[Chemical Formula 13]

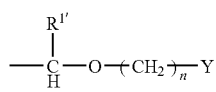

(p1-1)

wherein $R^{1'}$ represents a hydrogen atom or a lower alkyl group; n represents an integer of 0 to 3; and Y represents a lower alkyl group or an aliphatic cyclic group.

In the general formula (p1-1) above, $R^{1'}$ and n are respectively as defined for $R^{1'}$ and n in the general formula (I) above.

n is preferably an integer of 0 to 2, more preferably 0 or 1, and most preferably 0.

As the lower alkyl group for $R^{1'}$, the same as the lower alkyl groups for R above can be exemplified. As the lower alkyl group for $R^{1'}$, a methyl group or ethyl group is preferable, and a methyl group is particularly desirable.

In the present invention, a group in which $R^{1'}$ in the general formula (p1-1) above is a hydrogen atom is particularly preferable.

As the lower alkyl group for Y, the same as the lower alkyl groups for R above can be exemplified.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be exemplified, provided that the aliphatic monocyclic groups included in the structural unit represented by the general formula (I) above (a group in which 1 to 3 hydrogen atoms have been removed from cyclopentane) are excluded.

Specific examples of the aliphatic cyclic group for Y include those with structures represented by the chemical formulas shown below.

[Chemical Formula 14]

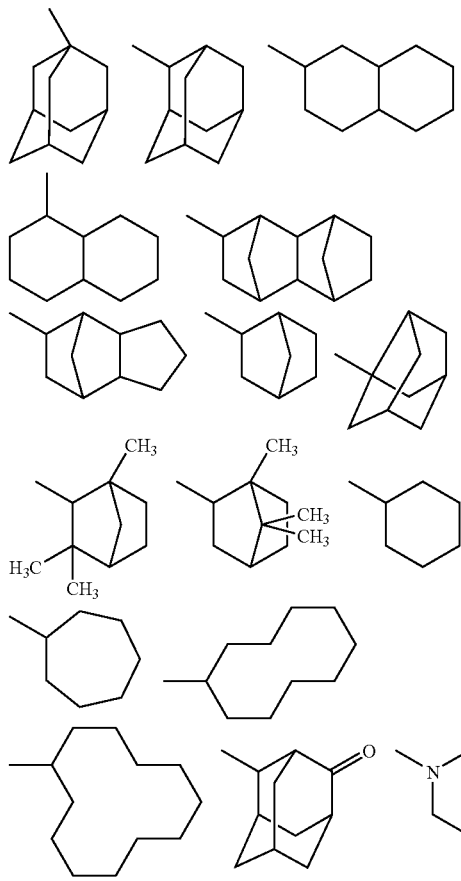

Further, as the acetal-type, acid dissociable, dissolution inhibiting group, groups represented by general formula (p2) shown below can also be exemplified.

[Chemical Formula 15]

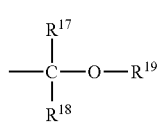

(p2)

wherein $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represent a linear or branched alkylene group, wherein the terminal of $R^{17}$ may be bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or a methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. Specific examples thereof include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated lower alkyl group. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4 to 7-membered ring, and more preferably a 4 to 6-membered ring. Specific examples of the cyclic group include a tetrahydropyranyl group and a tetrahydrofuranyl group.

As the structural unit (a1'), it is preferable to use at least one member selected from the group consisting of structural units represented by formula (a1-0-1) shown below and structural units represented by formula (a1-0-2) shown below.

[Chemical Formula 16]

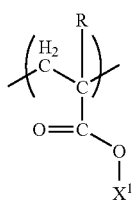

(a1-0-1)

wherein R represents a hydrogen atom, a halogen atom, a lower alkyl group or a halogenated lower alkyl group; and $X^1$ represents an acid dissociable, dissolution inhibiting group.

[Chemical Formula 17]

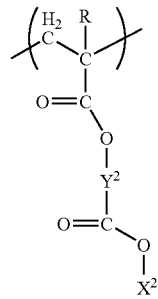

(a1-0-2)

wherein R represents a hydrogen atom, a halogen atom, a lower alkyl group or a halogenated lower alkyl group; $X^2$ represents an acid dissociable, dissolution inhibiting group; and $Y^2$ represents an alkylene group or an aliphatic cyclic group.

The halogen atom, lower alkyl group and halogenated lower alkyl group for R in the general formula (a1-0-1) are the same as the halogen atom, lower alkyl group and halogenated lower alkyl group which may be bonded to the α-position of the aforementioned acrylate ester.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is as defined for R in general formula (a1-0-1) above.

$X^2$ is the same as $X^1$ in general formula (a1-0-1).

$Y^2$ represents an alkylene group or an aliphatic cyclic group, and is preferably an alkylene group of 1 to 4 carbon atoms or a divalent aliphatic cyclic group. As the aliphatic cyclic group, the same as those exemplified above in connection with the explanation of "aliphatic cyclic group" can be used, except that two or more hydrogen atoms have been removed therefrom.

Specific examples of the structural unit (a1') include structural units represented by general formulas (a1-1) to (a1-4) shown below.

[Chemical Formula 18]

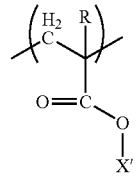

(a1-1)

-continued

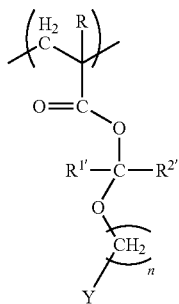
(a1-2)

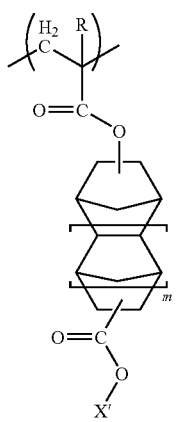
(a1-3)

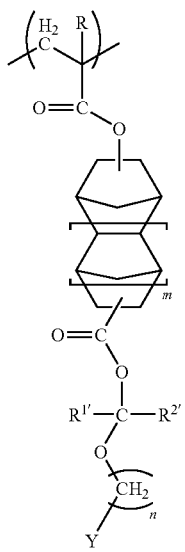
(a1-4)

wherein X' represents a tertiary alkyl ester-type acid dissociable, dissolution inhibiting group; Y represents a lower alkyl group of 1 to 5 carbon atoms or an aliphatic cyclic group; n represents an integer of 0 to 3; m represents 0 or 1; R represents a hydrogen atom, a halogen atom, a lower alkyl group or a halogenated lower alkyl group; and each of $R^{1'}$ and $R^{2'}$ independently represent a hydrogen atom or a lower alkyl group of 1 to 5 carbon atoms.

In general formulas (a1-1) to (a1-4), the halogen atom, lower alkyl group and halogenated lower alkyl group for R are the same as the halogen atom, lower alkyl group and halogenated lower alkyl group which can be bonded to the α-position of the aforementioned acrylate ester.

It is preferable that at least one of $R^{1'}$ and $R^{2'}$ represent a hydrogen atom, and it is more preferable that both of $R^{1'}$ and $R^{2'}$ represent a hydrogen atom. n is preferably 0 or 1.

Examples of the tertiary alkyl ester-type acid dissociable, dissolution inhibiting group for X' are the same as the above-exemplified tertiary alkyl ester-type acid dissociable, dissolution inhibiting groups for $X^1$.

Examples of the aliphatic cyclic group for Y are the same as those exemplified above in connection with the explanation of "aliphatic cyclic group".

Specific examples of structural units represented by general formulas (a1-1) to (a1-4) above are shown below.

[Chemical Formula 19]

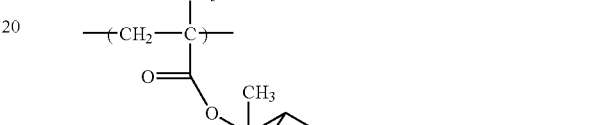
(a1-1-1)

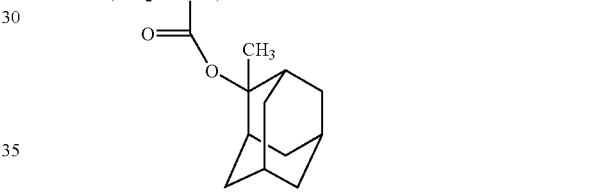
(a1-1-2)

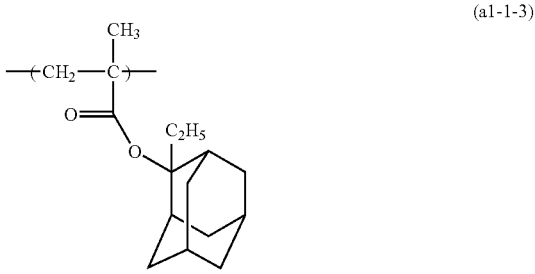
(a1-1-3)

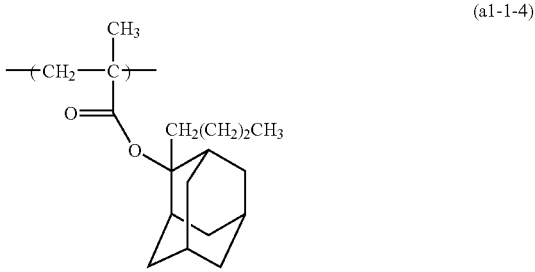
(a1-1-4)

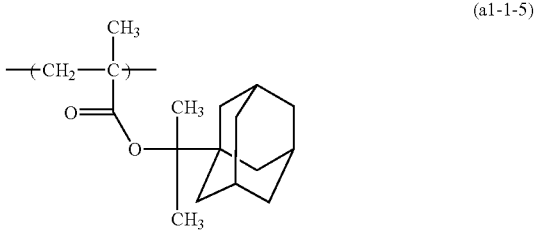
(a1-1-5)

(a1-1-6) 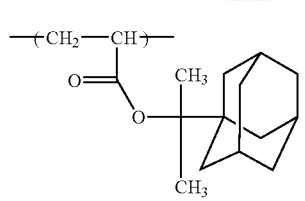
(a1-1-7) 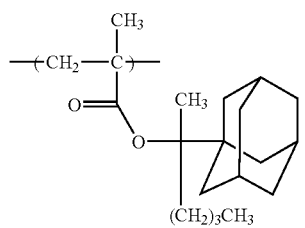
(a1-1-8) 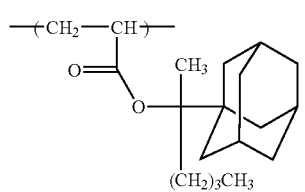
(a1-1-9) 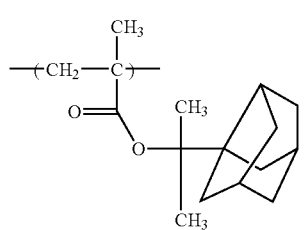
(a1-1-10) 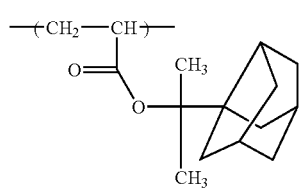
(a1-1-11) 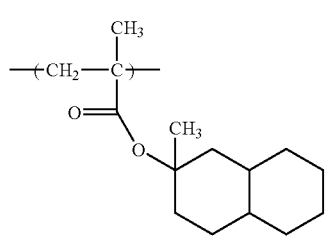
(a1-1-12) 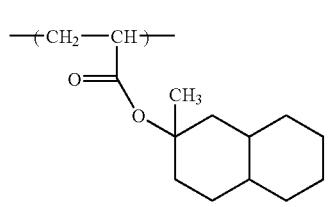
(a1-1-13) 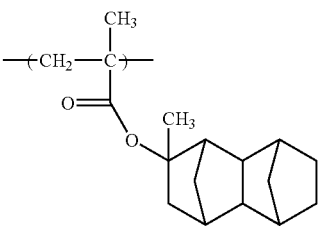
(a1-1-14) 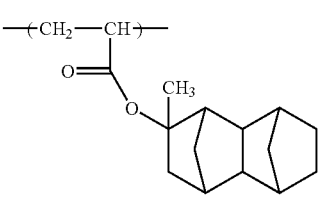
(a1-1-15) 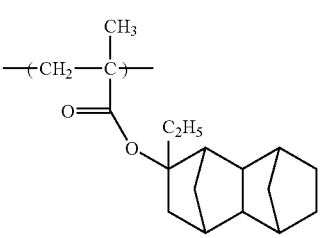
(a1-1-16) 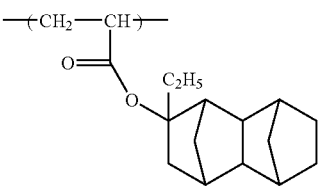
[Chemical Formula 20]
(a1-1-17) 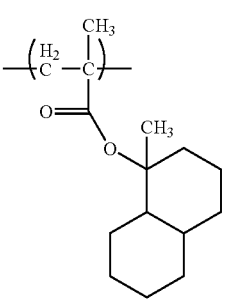
(a1-1-18) 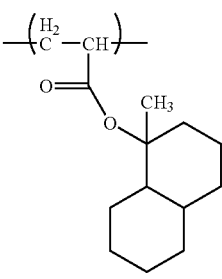

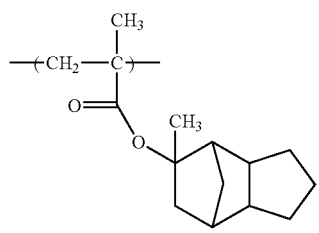
(a1-1-19)
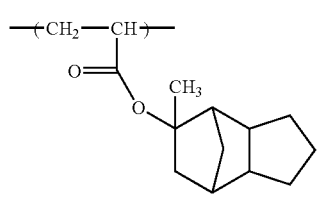
(a1-1-20)
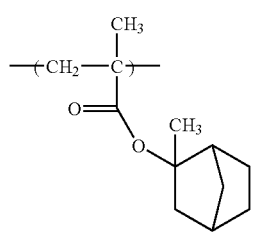
(a1-1-21)
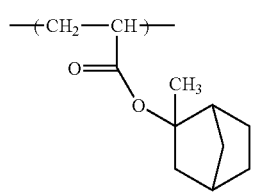
(a1-1-22)
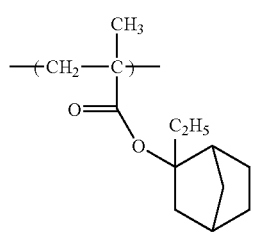
(a1-1-23)
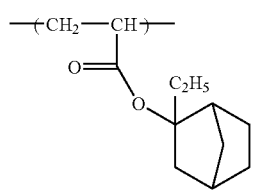
(a1-1-24)
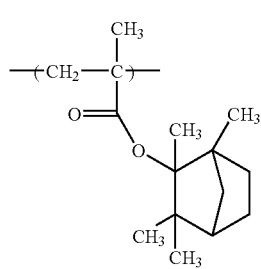
(a1-1-25)
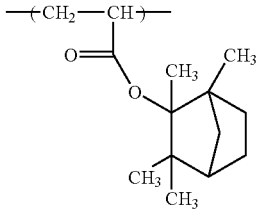
(a1-1-26)
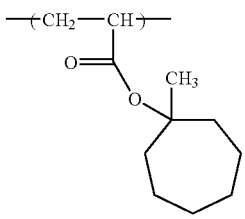
(a1-1-27)
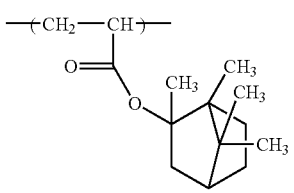
(a1-1-28)
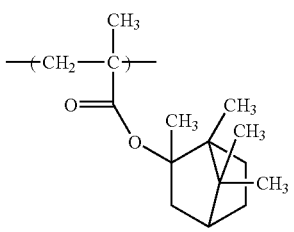
(a1-1-29)
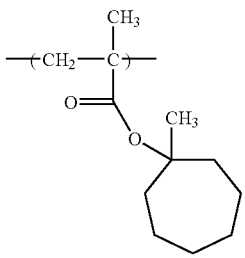
(a1-1-30)
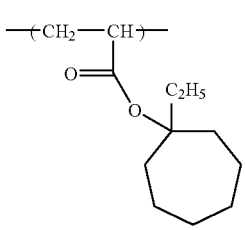
(a1-1-31)
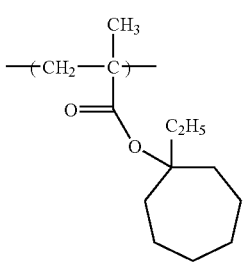
(a1-1-32)

[Chemical Formula 21]
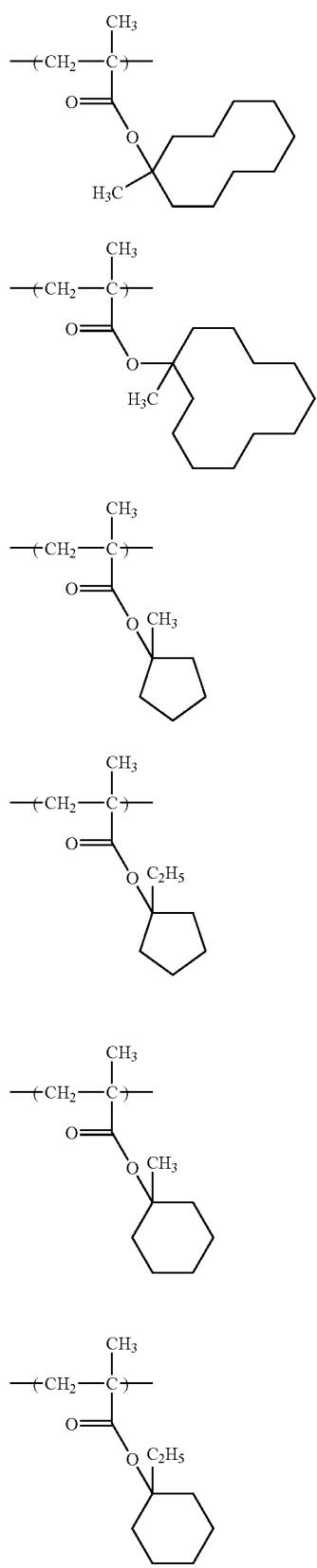
(a1-1-33)
(a1-1-34)
(a1-1-35)
(a1-1-36)
(a1-1-37)
(a1-1-38)
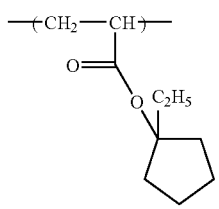
(a1-1-39)
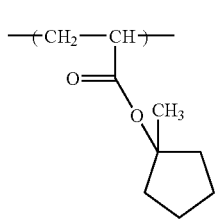
(a1-1-40)
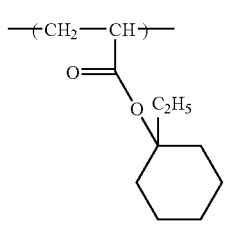
(a1-1-41)
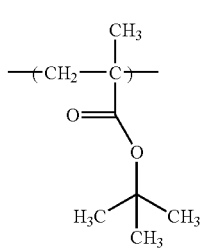
(a1-1-42)
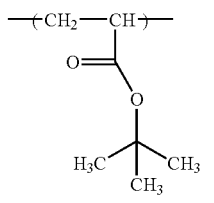
(a1-1-43)
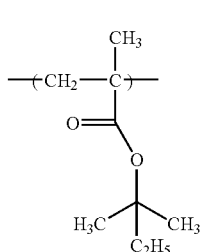
(a1-1-44)
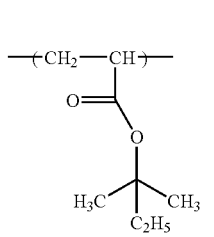
(a1-1-45)

[Chemical Formula 22]
(a1-2-1) 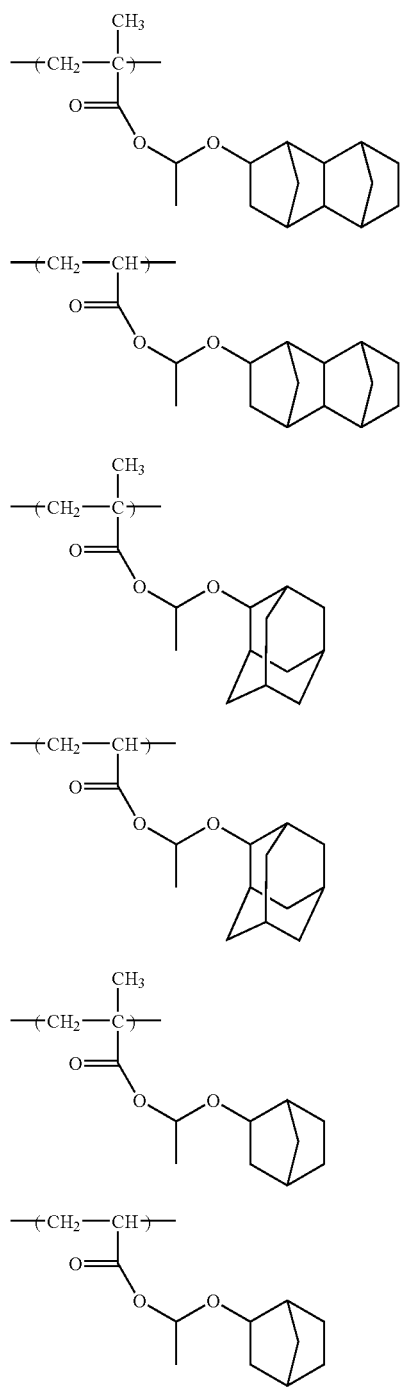
(a1-2-2)
(a1-2-3)
(a1-2-4)
(a1-2-5)
(a1-2-6)
[Chemical Formula 23]
(a1-2-7) 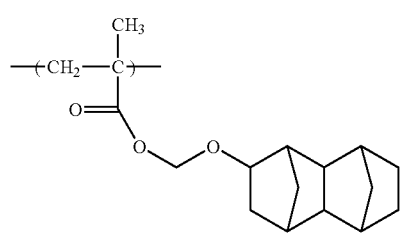
(a1-2-8) 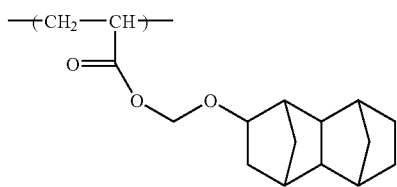
(a1-2-9) 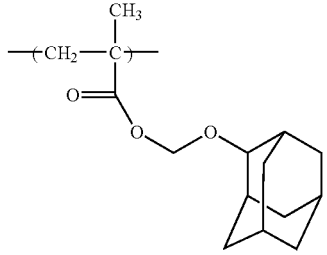
(a1-2-10) 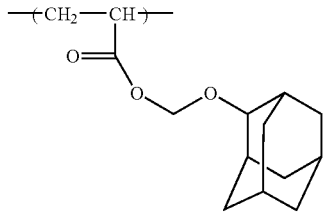
(a1-2-11) 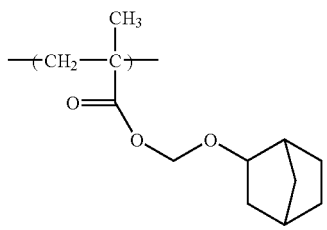
(a1-2-12) 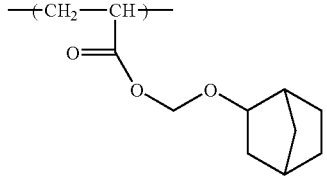
(a1-2-13) 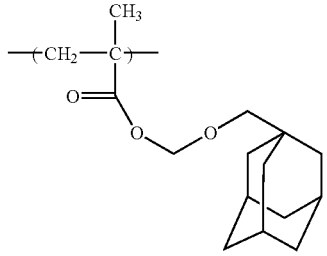
(a1-2-14) 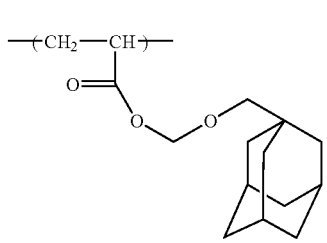

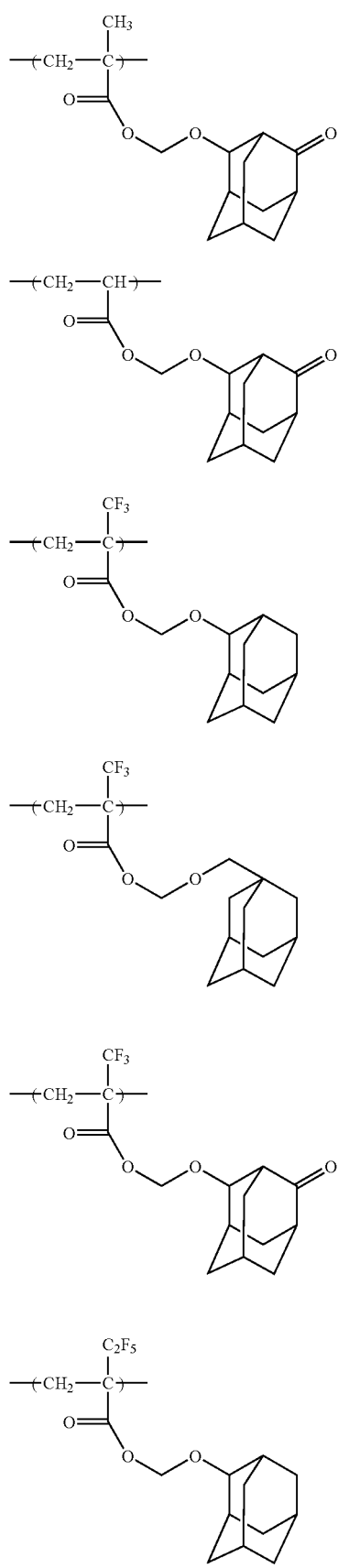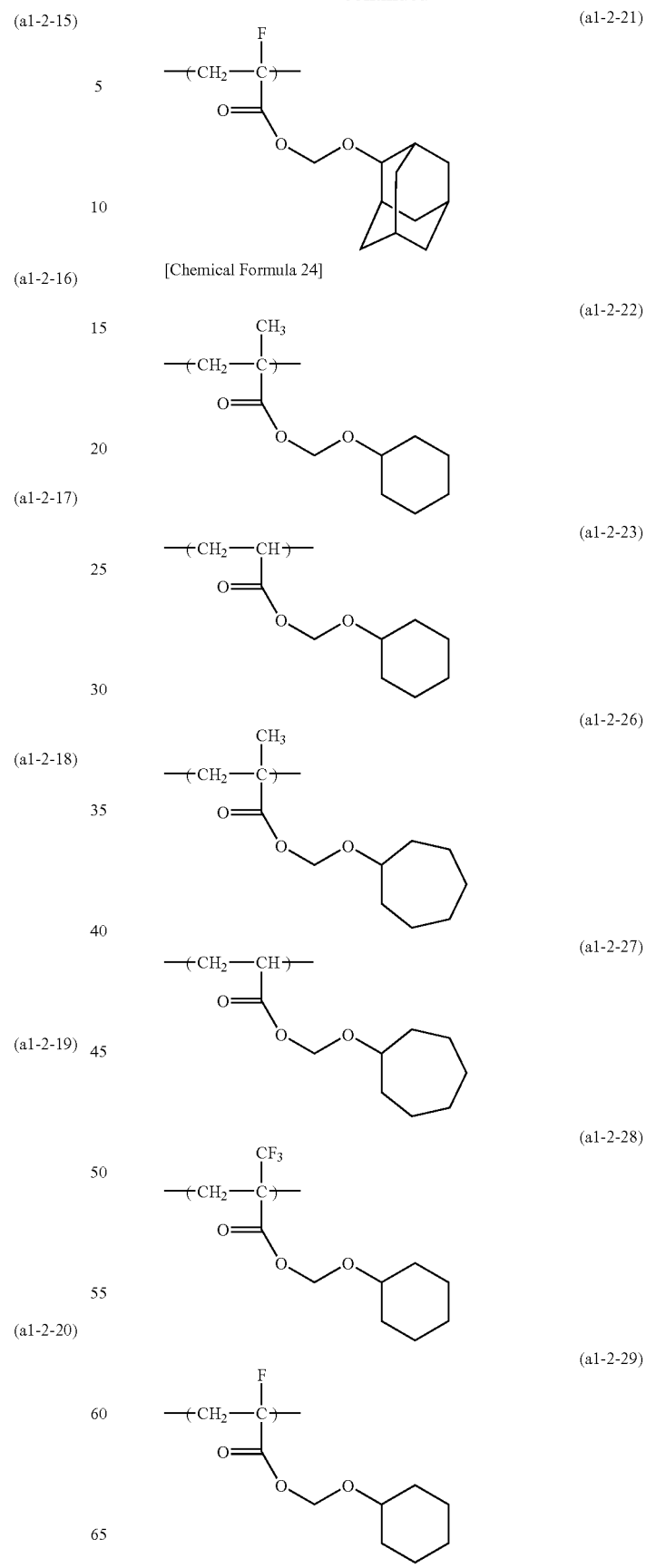

(a1-2-32)
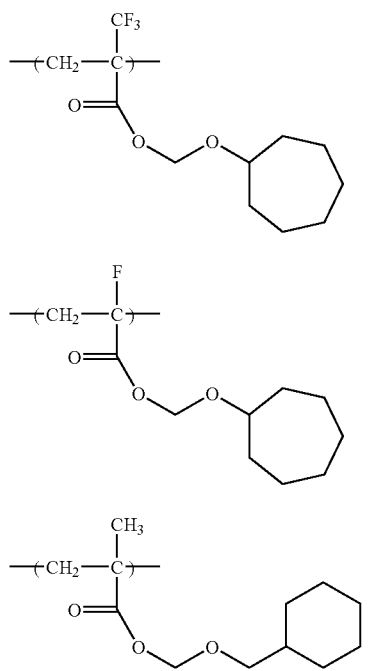
(a1-2-33)
(a1-2-34)
[Chemical Formula 25]
(a1-2-37)
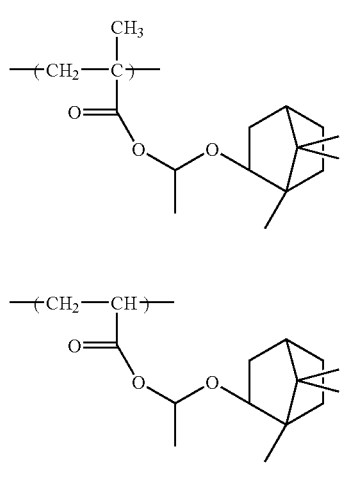
(a1-2-38)
(a1-2-39)
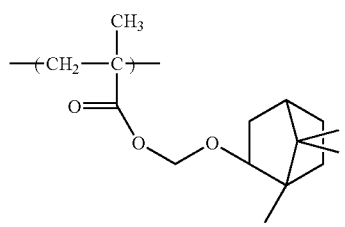
(a1-2-40)
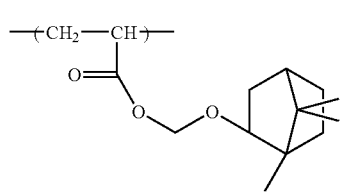
(a1-2-41)
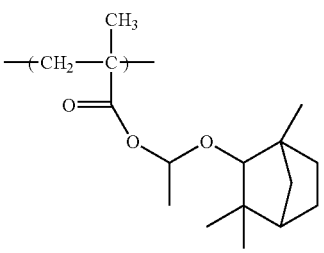
(a1-2-42)
(a1-2-43)
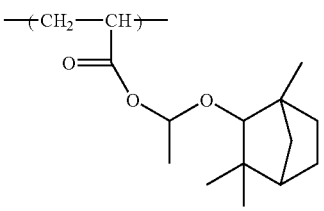
(a1-2-44)
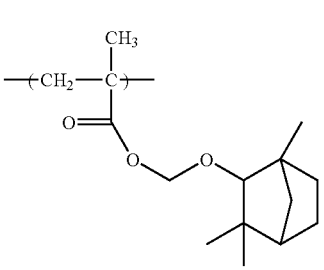
[Chemical Formula 26]
(a1-3-1)
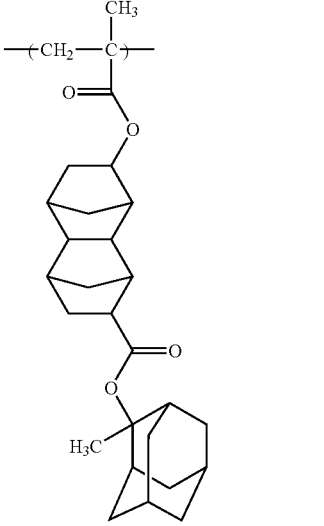

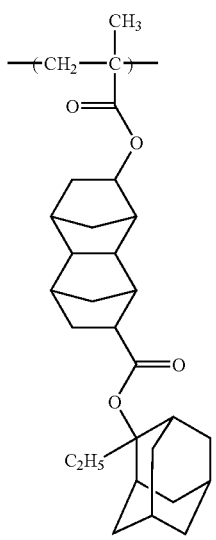
(a1-3-2)
(a1-3-3)
(a1-3-4)
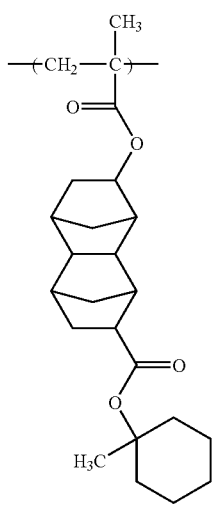
(a1-3-5)
(a1-3-6)
(a1-3-7)

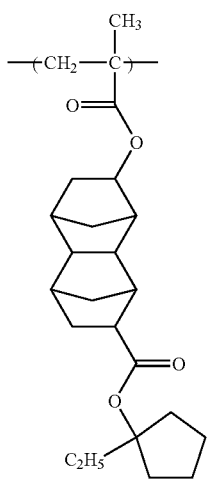 (a1-3-8)
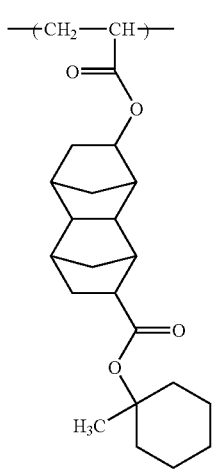 (a1-3-9)
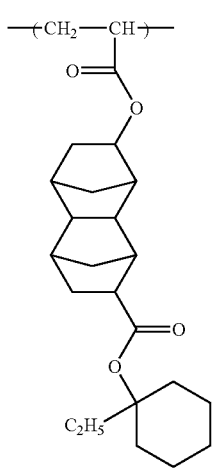 (a1-3-10)
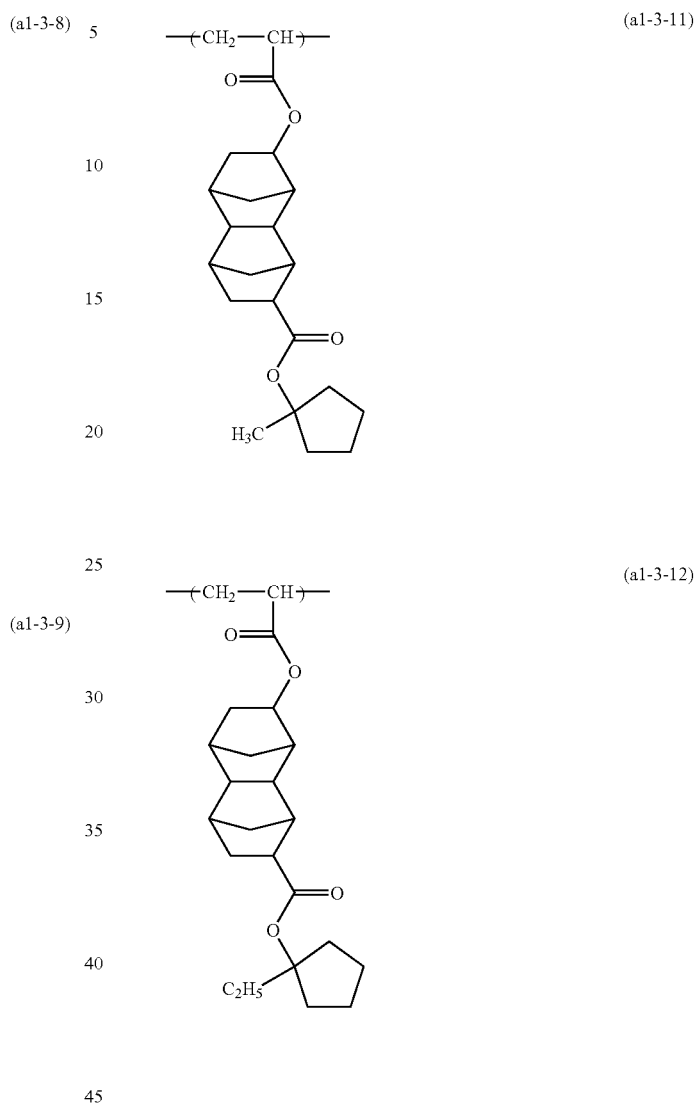
(a1-3-11)
(a1-3-12)
[Chemical Formula 27]
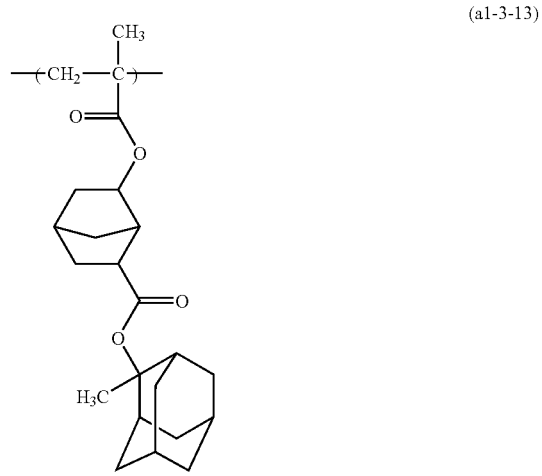 (a1-3-13)

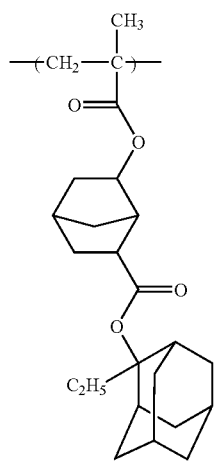
(a1-3-14)
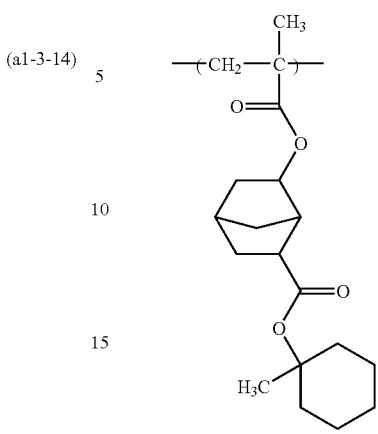
(a1-3-17)
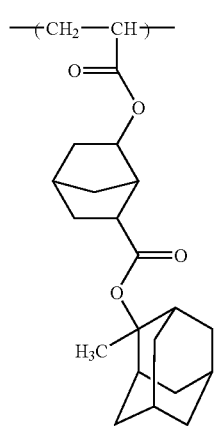
(a1-3-15)
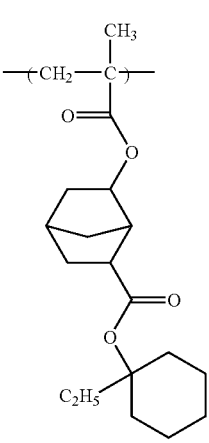
(a1-3-18)
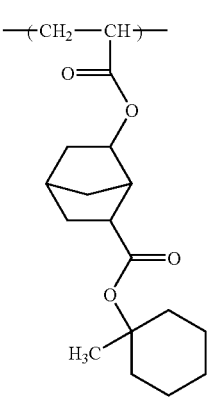
(a1-3-19)
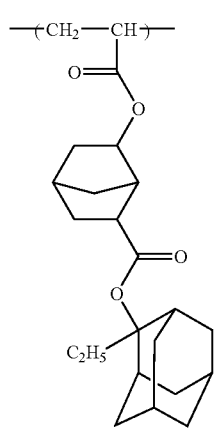
(a1-3-16)
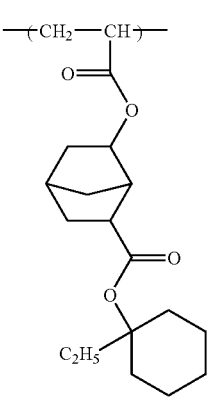
(a1-3-20)

-continued
(a1-3-21)
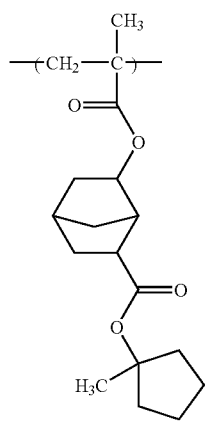
(a1-3-22)
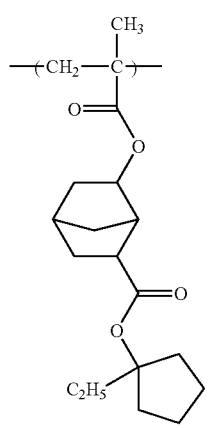
(a1-3-23)
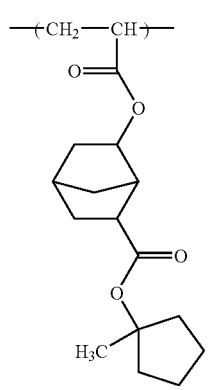
(a1-3-24)
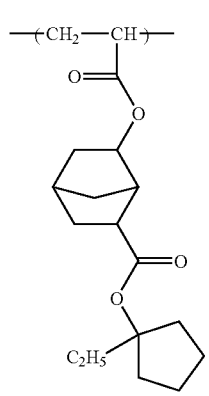
[Chemical Formula 28]
(a1-4-1)
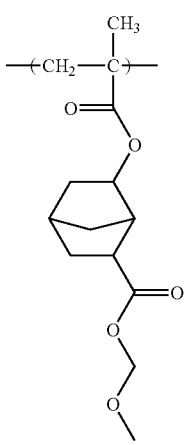
(a1-4-2)
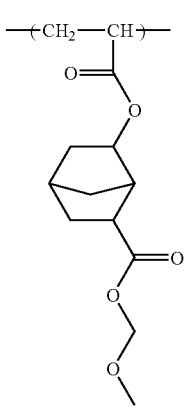
(a1-4-3)
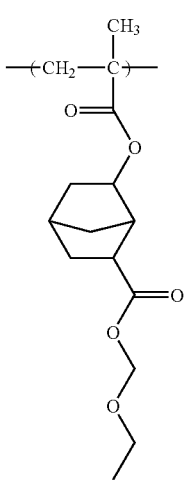

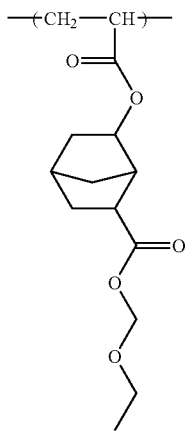
(a1-4-4)
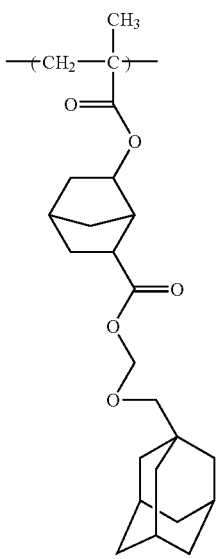
(a1-4-7)
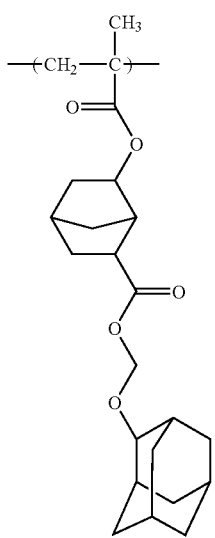
(a1-4-5)
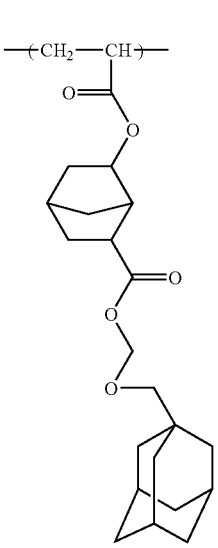
(a1-4-8)
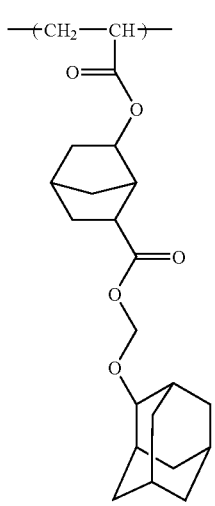
(a1-4-6)
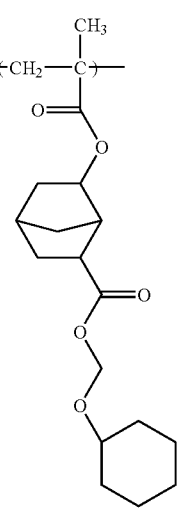
(a1-4-9)

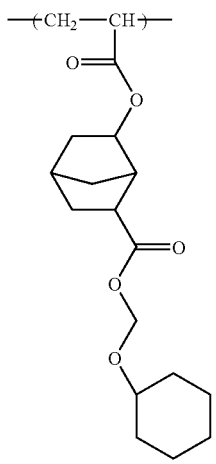
(a1-4-10)
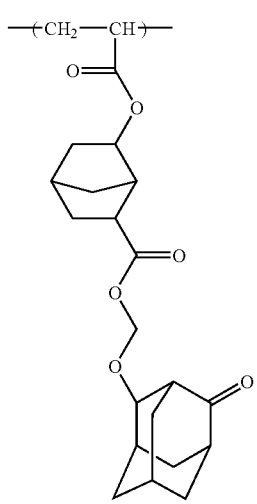
(a1-4-13)
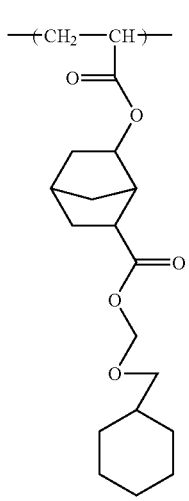
(a1-4-11)
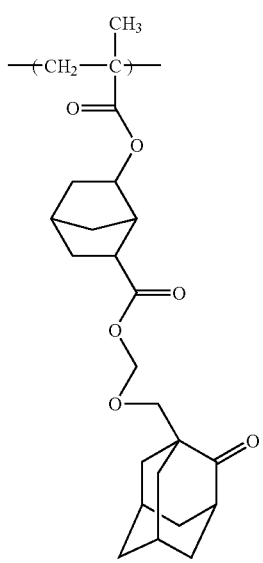
(a1-4-14)
(a1-4-12)
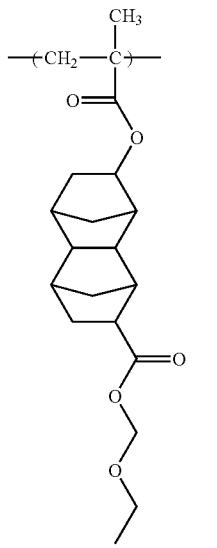
(a1-4-15)

[Chemical Formula 29]
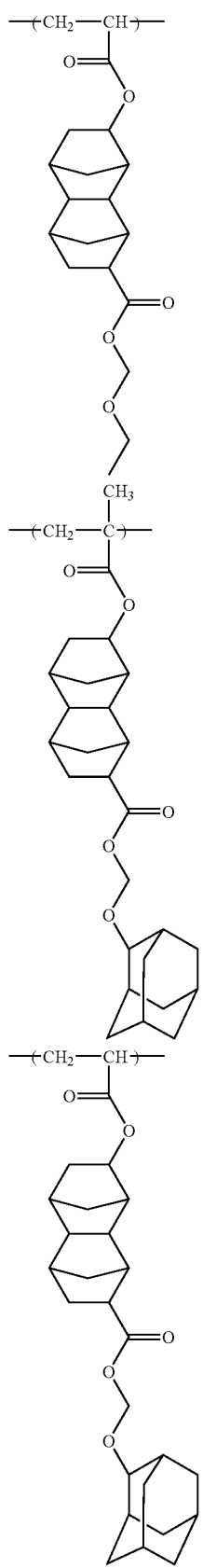
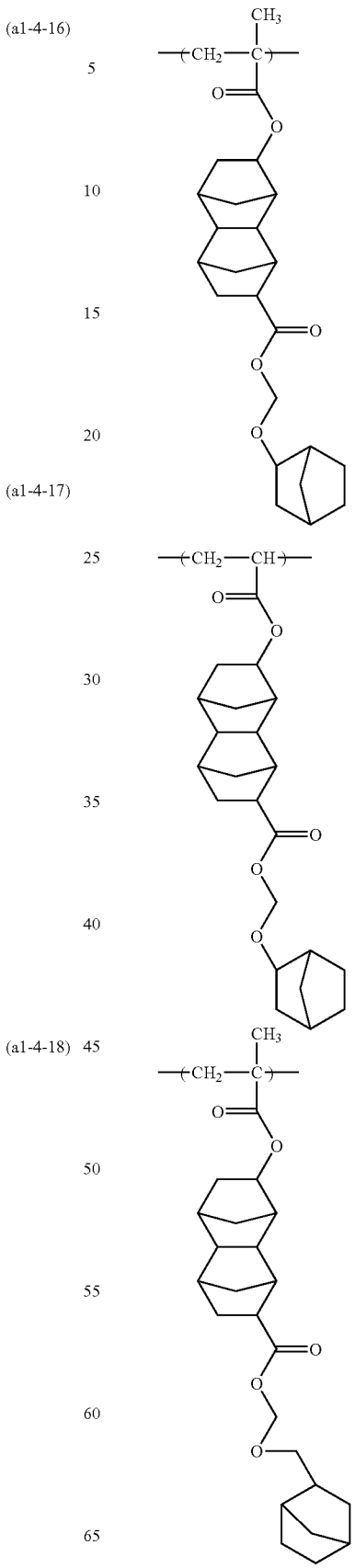

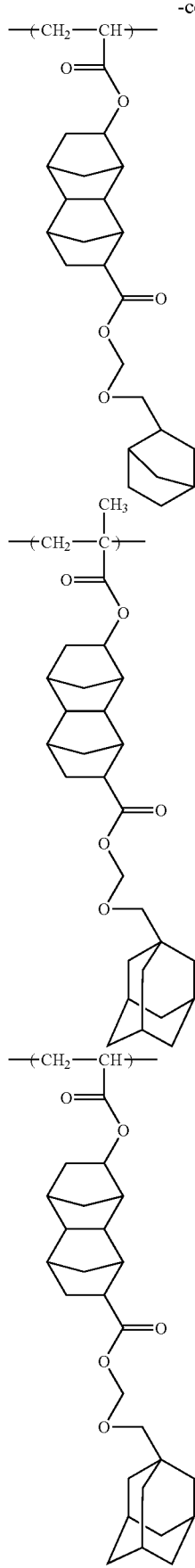
(a1-4-22)
(a1-4-23)
(a1-4-24)
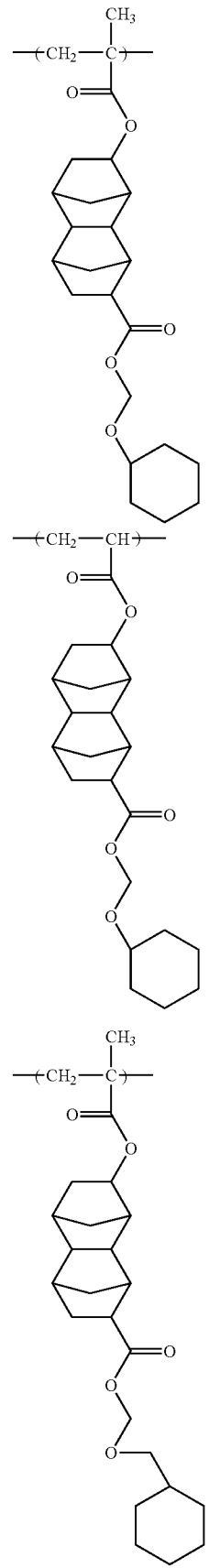
(a1-4-25)
(a1-4-26)
(a1-4-27)

(a1-4-28) 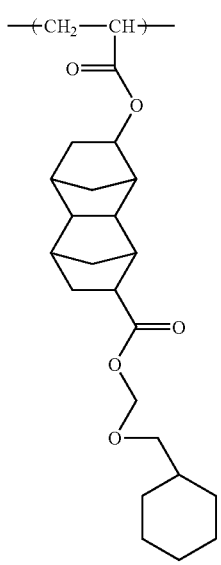

(a1-4-29) 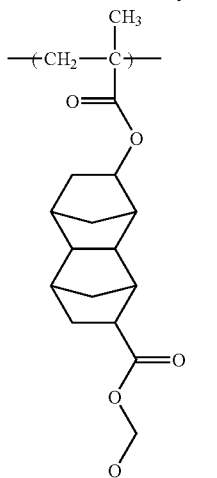

(a1-4-30) 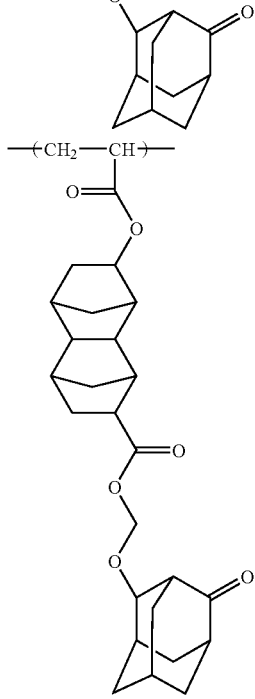

As the structural unit (a1') in the component (A), one type of structural unit may be used alone, or two or more types of structural units may be used in combination.

In the component (A), the amount of the structural unit (a1') based on the combined total of all structural units constituting the component (A) is preferably 10 to 80 mol %, more preferably 20 to 70 mol %, and still more preferably 25 to 50 mol %. By making the amount of the structural unit (a1') at least as large as the lower limit of the above-mentioned range, a pattern can be easily formed using a resist composition prepared from the component (A). On the other hand, by making the amount of the structural unit (a1') no more than the upper limit of the above-mentioned range, a good balance can be achieved with the other structural units.

Structural Unit (a4)

In the present invention, the component (A) may further include a structural unit (a4) derived from an acrylate ester containing a non-acid dissociable, aliphatic polycyclic group.

Examples of the polycyclic group include the same groups as those described above in connection with the aforementioned structural unit (a1'), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may or may not have a substituent. As the substituent, a linear or branched alkyl group of 1 to 5 carbon atoms can be exemplified.

Specific examples of the structural unit (a4) include units with structures represented by general formulas (a4-1) to (a4-5) shown below.

[Chemical Formula 30]

(a4-1) 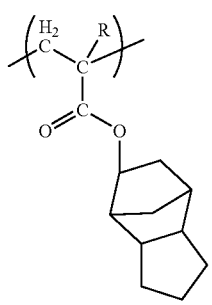

(a4-2) 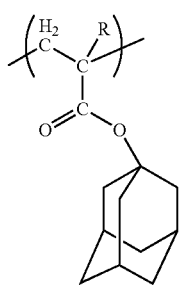

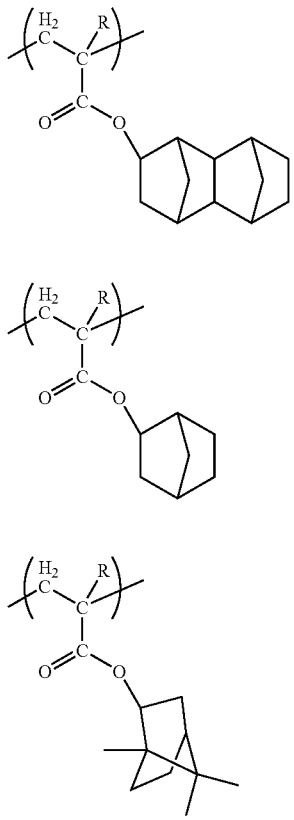

(a4-3)

(a4-4)

(a4-5)

wherein R represents a hydrogen atom, a halogen atom, a lower alkyl group or a halogenated lower alkyl group.

In general formulas (a4-1) to (a4-5), the halogen atom, lower alkyl group and halogenated lower alkyl group for R are the same as the halogen atom, lower alkyl group and halogenated lower alkyl group which can be bonded to the α-position of the aforementioned acrylate ester.

When the component (A) contains the structural unit (a4), the amount of the structural unit (a4) in the component (A) based on the combined total of all structural units constituting the component (A) is preferably 1 to 30 mol %, and more preferably 10 to 20 mol %.

In the present invention, the component (A) is a resin (polymer) including at least the structural unit (a1) above, and is preferably a copolymer that includes the structural unit (a1), the structural unit (a2), and/or the structural unit (a3). Examples of the copolymer include a copolymer formed from the structural units (a1) and (a2) above, a copolymer formed from the structural units (a1) and (a3) above, a copolymer formed from the structural units (a1), (a2), and (a3) above, and a copolymer formed from the structural units (a1), (a2), and (a3) above as well as the structural unit (a4).

In the positive resist composition of the present invention, as the component (A), one type may be used alone, or two or more types may be used in combination.

In the present invention, as the component (A), a copolymer having a combination of structural units shown in the following formula (A1-11) is particularly preferable.

[Chemical Formula 31]

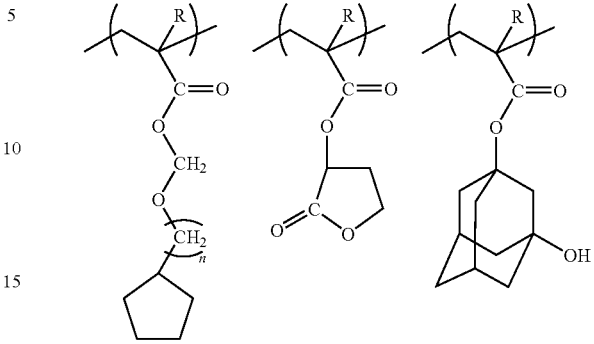

(A1-11)

wherein R represents a hydrogen atom, a halogen atom, a lower alkyl group or a halogenated lower alkyl group; and n represents an integer of 0 to 3.

In general formula (A1-11), R is preferably a hydrogen atom or a methyl group, and a methyl group is particularly desirable.

n is more preferably an integer of 0 or 1, and most preferably 0.

The component (A) can be obtained, for example, by a conventional radical polymerization or the like of the monomers corresponding with each of the structural units, using a radical polymerization initiator such as azobisisobutyronitrile (AIBN).

Furthermore, in the component (A), by using a chain transfer agent such as HS—$CH_2$—$CH_2$—$CH_2$—$C(CF_3)_2$—OH, a —$C(CF_3)_2$—OH group can be introduced at the terminals of the component (A). Such a copolymer having introduced a hydroxyalkyl group in which a part of the hydrogen atoms of the alkyl group are substituted with fluorine atoms is effective in reducing developing defects and LER (line edge roughness: unevenness of the side walls of a line pattern).

The weight average molecular weight (Mw) (the polystyrene equivalent value determined by gel permeation chromatography) of the component (A) is not particularly limited, but is preferably 2,000 to 50,000, more preferably 3,000 to 30,000, and most preferably 5,000 to 20,000. By making the weight average molecular weight no more than the upper limit of the above-mentioned range, the component (A) exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

In the present invention, the quantity of the component (A) in the positive resist composition is preferably adjusted in accordance with the film thickness of the resist that is to be formed.

<Component (B)>

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator, a compound represented by general formula (b-0) shown below can be preferably used.

[Chemical Formula 32]

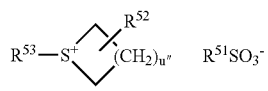

(b-0)

wherein $R^{51}$ represents a linear, branched or cyclic alkyl group, or a linear, branched or cyclic fluorinated alkyl group; $R^{52}$ represents a hydrogen atom, a hydroxyl group, a halogen atom, a linear or branched alkyl group, a linear or branched halogenated alkyl group, or a linear or branched alkoxy group; $R^{53}$ represents an aryl group which may have a substituent; and u" represents an integer of 1 to 3.

In general formula (b-0), $R^{51}$ represents a linear, branched or cyclic alkyl group, or a linear, branched or cyclic fluorinated alkyl group.

The linear or branched alkyl group preferably has 1 to 10 carbon atoms, more preferably 1 to 8 carbon atoms, and most preferably 1 to 4 carbon atoms.

The cyclic alkyl group preferably has 4 to 12 carbon atoms, more preferably 5 to 10 carbon atoms, and most preferably 6 to 10 carbon atoms.

The linear or branched fluorinated alkyl group preferably has 1 to 10 carbon atoms, more preferably 1 to 8 carbon atoms, and most preferably 1 to 4 carbon atoms.

The cyclic fluorinated alkyl group preferably has 4 to 12 carbon atoms, more preferably 5 to 10 carbon atoms, and most preferably 6 to 10 carbon atoms.

Further, the fluorination ratio of the fluorinated alkyl group (percentage of the number of fluorine atoms substituting the hydrogen atoms, based on the total number of all hydrogen atoms within the alkyl group) is preferably from 10 to 100%, more preferably from 50 to 100%, and it is particularly desirable that all of the hydrogen atoms are substituted with fluorine atoms, as the acid strength increases.

$R^{51}$ is most preferably a linear alkyl group or a linear fluorinated alkyl group.

$R^{52}$ represents a hydrogen atom, a hydroxyl group, a halogen atom, a linear or branched alkyl group, a linear or branched halogenated alkyl group, or a linear or branched alkoxy group.

Examples of the halogen atom for $R^{52}$ include a fluorine atom, a bromine atom, a chlorine atom and an iodine atom, and a fluorine atom is preferable.

The alkyl group for $R^{52}$ is linear or branched, and preferably has 1 to 5 carbon atoms, more preferably 1 to 4 carbon atoms, and most preferably 1 to 3 carbon atoms.

The halogenated alkyl group for $R^{52}$ is a linear or branched group in which some or all of the hydrogen atoms of the alkyl group have been substituted with halogen atoms. As the alkyl group of the halogenated alkyl group, the same as the linear or branched alkyl group for $R^{52}$ may be exemplified. As the halogen atoms for substituting the hydrogen atoms of the alkyl group, the same as the halogen atom for $R^{52}$ may be exemplified. In the halogenated alkyl group, it is preferable that 50 to 100% of the hydrogen atoms of the alkyl group be substituted with halogen atoms, and it is more preferable that all of the hydrogen atoms are substituted with halogen atoms.

The alkoxy group for $R^{52}$ is linear or branched, and preferably has 1 to 5 carbon atoms, more preferably 1 to 4 carbon atoms, and most preferably 1 to 3 carbon atoms.

Among these, as $R^{52}$, a hydrogen atom is particularly desirable.

$R^{53}$ represents an aryl group which may have a substituent, and examples of the basic ring excluding the substituent include a naphthyl group, a phenyl group and an anthracenyl group. In terms of the effects of the present invention and absorption of exposure ray such as ArF excimer laser, a phenyl group is preferable.

Examples of the substituent include a hydroxyl group and a lower alkyl group (linear or branched, and preferably has 1 to 5 carbon atoms, and a methyl group is particularly desirable).

As the aryl group for $R^{53}$, those which do not have a substituent are preferable.

u" is an integer of 1 to 3, preferably 2 or 3, and it is particularly desirable that u" be 3.

As preferable examples of acid generators represented by general formula (b-0), the following can be exemplified.

[Chemical Formula 33]

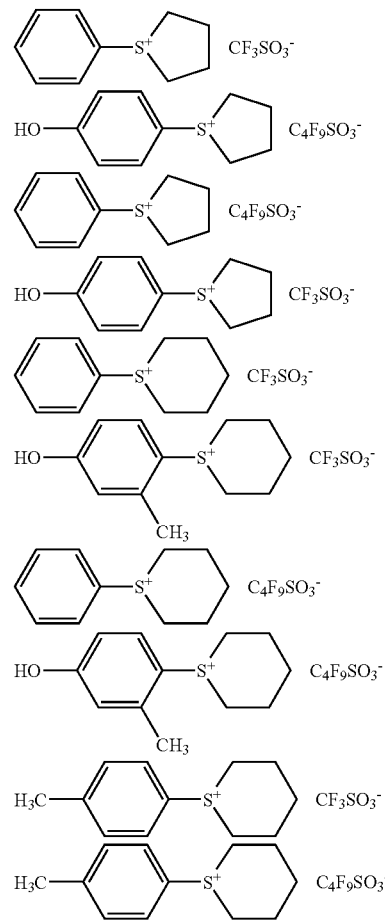

As the acid generators represented by general formula (b-0), one type of acid generator may be used alone, or two or more types may be used in combination.

As an onium salt-based acid generator other than those represented by general formula (b-0), a compound represented by general formula (b-1) or (b-2) shown below can be preferably used.

[Chemical Formula 34]

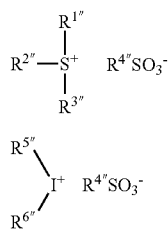

(b-1)

(b-2)

wherein $R^{1'''}$ to $R^{3'''}$, $R^{5'''}$ and $R^{6'''}$ each independently represent an aryl group or alkyl group; and $R^{4'''}$ represents a linear, branched or cyclic alkyl group or a linear, branched or cyclic fluorinated alkyl group, with the proviso that at least one of $R^{1'''}$ to $R^{3'''}$ represents an aryl group, and at least one of $R^{5'''}$ and $R^{6'''}$ represents an aryl group.

In formula (b-1), $R^{1'''}$ to $R^{3'''}$ each independently represents an aryl group or an alkyl group. Further, among $R^{1'''}$ to $R^{3'''}$, at least one group represents an aryl group. Among $R^{1'''}$ to $R^{3'''}$, two or more groups are preferably aryl groups, and it is particularly desirable that all of $R^{1'''}$ to $R^{3'''}$ are aryl groups.

The aryl group for $R^{1'''}$ to $R^{3'''}$ is not particularly limited. For example, an aryl group having 6 to 20 carbon atoms may be used in which some or all of the hydrogen atoms of the aryl group may or may not be substituted with alkyl groups, alkoxy groups, or halogen atoms. The aryl group is preferably an aryl group having 6 to 10 carbon atoms because it can be synthesized at a low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group for $R^{1'''}$ to $R^{3'''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is particularly desirable that $R^{1'''}$ to $R^{3'''}$ each independently represent a phenyl group or a naphthyl group.

$R^{4'''}$ represents a linear, branched or cyclic alkyl group or a fluorinated alkyl group.

The linear or branched alkyl group preferably has 1 to 10 carbon atoms, more preferably 1 to 8 carbon atoms, and most preferably 1 to 4 carbon atoms.

The cyclic alkyl group is preferably a cyclic group, as described for $R^{1'''}$, having 4 to 15 carbon atoms, more preferably 4 to 10 carbon atoms, and most preferably 6 to 10 carbon atoms.

The linear or branched fluorinated alkyl group preferably has 1 to 10 carbon atoms, more preferably 1 to 8 carbon atoms, and most preferably 1 to 4 carbon atoms.

The cyclic fluorinated alkyl group is preferably a cyclic group, as described for $R^{1'''}$, having 4 to 15 carbon atoms, more preferably 4 to 10 carbon atoms, and most preferably 6 to 10 carbon atoms.

Further, the fluorination ratio of the fluorinated alkyl group (percentage of fluorine atoms within the alkyl group) is preferably from 10 to 100%, more preferably from 50 to 100%, and it is particularly desirable that all hydrogen atoms are substituted with fluorine atoms because the acid strength increases.

$R^{4'''}$ is most preferably a linear or cyclic alkyl group or a linear or cyclic fluorinated alkyl group.

In formula (b-2), $R^{5'''}$ and $R^{6'''}$ each independently represents an aryl group or an alkyl group. At least one of $R^{5'''}$ and $R^{6'''}$ represents an aryl group. It is preferable that both of $R^{5'''}$ and $R^{6'''}$ represent an aryl group.

As the aryl group for $R^{5'''}$ and $R^{6'''}$, the same as the aryl groups for $R^{1'''}$ to $R^{3'''}$ can be exemplified.

As the alkyl group for $R^{5'''}$ and $R^{6'''}$, the same as the alkyl groups for $R^{1'''}$ to $R^{3'''}$ can be exemplified.

It is particularly desirable that both of $R^{5'''}$ and $R^{6'''}$ represent a phenyl group.

As $R^{4'''}$ in formula (b-2), the same as those mentioned above for $R^{4'''}$ in formula (b-1) can be exemplified.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; and di(1-naphthyl)phenylsulfonium trifluoromethanesulfonate, heptafluoropropanesulfonate or nonafluorobutanesulfonate. It is also possible to use onium salts in which the anion moiety of these onium salts are replaced by methanesulfonate, n-propanesulfonate, n-butanesulfonate, or n-octanesulfonate.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may also be used.

[Chemical Formula 35]

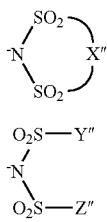

wherein X" represents an alkylene group of 2 to 6 carbon atoms in which at least one hydrogen atom has been substituted with a fluorine atom; and Y" and Z" each independently represent an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group for X" or those of the alkyl group for Y" and Z" within the above-mentioned range of the number of carbon atoms, the more preferable since the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved. The percentage of the fluorine atoms within the alkylene group or alkyl group, i.e., the fluorination ratio is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

In the present description, an oximesulfonate-based acid generator is a compound having at least one group represented by general formula (B-1) shown below, and has a feature of generating acid by irradiation. Such oxime-sulfonate-based acid generators are widely used for a chemically amplified resist composition, and can be appropriately selected.

[Chemical Formula 36]

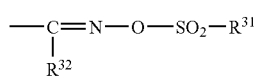

(B-1)

wherein $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms. Examples of the above-mentioned halogen atom include a fluorine atom, a chlorine atom, a bromine atom and an iodine atom, and a fluorine atom is particularly desirable.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 37]

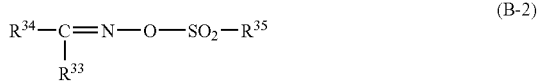

(B-2)

wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 38]

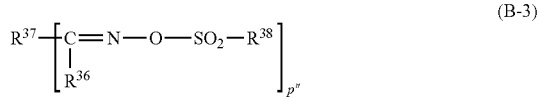

(B-3)

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p″ represents 2 or 3.

In general formula (B-2) above, the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and still more preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthracyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group, halogenated alkyl group, and alkoxy group as the substituent preferably has 1 to 8 carbon atoms, and more preferably 1 to 4 carbon atoms. Examples of the halogen atom within the halogenated alkyl group include a fluorine atom, a chlorine atom, a bromine atom and an iodine atom. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a partially or completely fluorinated alkyl group (that is, a fluorinated alkyl group) is more preferable.

In terms of enhancing the strength of the acid generated, the fluorinated alkyl group for $R^{35}$ preferably has 50% or more of the hydrogen atoms fluorinated, more preferably 70% or more, and still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p″ is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be exemplified.

[Chemical Formula 39]

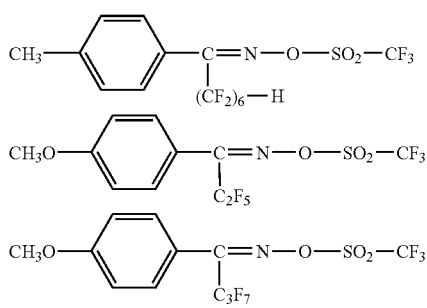

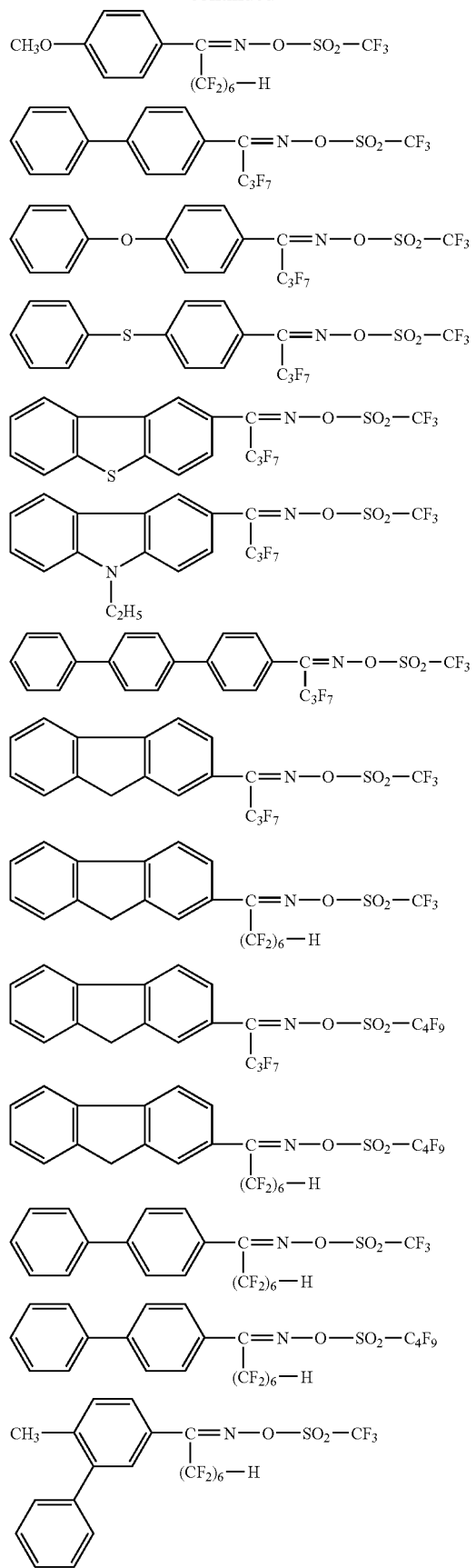

Further, as more preferable examples of oxime sulfonate-based acid generators, the following 4 compounds can be exemplified.

[Chemical Formula 40]

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be exemplified.

As the component (B), one type of these acid generators may be used alone, or two or more types may be used in combination.

In the present invention, as the component (B), it is particularly preferable to use an onium salt in which an anion is a fluorinated alkylsulfonate ion.

The amount of the component (B) within the positive resist composition of the present invention is 0.5 to 30 parts by weight, and preferably 1 to 15 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Component (D)>

For improving the resist pattern shape and the post exposure stability of the latent image formed by the pattern-wise exposure of the resist layer, it is preferable that the positive resist composition of the present invention further contains a nitrogen-containing organic compound (D) (hereafter referred to as the component (D)) as an optional component.

A multitude of these components (D) have already been proposed, and any of these known compounds may be used, although an aliphatic amine, and particularly a secondary aliphatic amine or tertiary aliphatic amine is preferable. In the present description and claims, the term "aliphatic" is a relative concept used in relation to the term "aromatic", and defines a group or compound that has no aromaticity.

The term "aliphatic cyclic group" refers to a monocyclic group or polycyclic group that has no aromaticity. An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of 1 to 12 carbon atoms (i.e., alkylamines or alkyl alcohol amines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly preferable, and tri-n-pentylamine is most preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Of these, one type may be used alone, or two or more types may be used in combination.

In the present invention, as the component (D), alkylamines are preferable, and it is particularly preferable to use trialkylamines of 5 to 10 carbon atoms.

The component (D) is typically used in an amount within a range from 0.01 to 5.0 parts by weight, relative to 100 parts by weight of the component (A).

<Optional Component>

Furthermore, in the positive resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of phosphorus oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferable, and salicylic acid is most preferable.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

The positive resist composition of the present invention can be prepared by dissolving the materials for the resist composition (the component (A), component (B), and if desired, the aforementioned optional components) in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-amyl ketone, methyl isoamyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, amylbenzene, isopropylbenzene, toluene, xylene, cymene and mesitylene.

These organic solvents can be used individually, or in combination as a mixed solvent.

Among these, propylene glycol monomethyl ether acetate (PGMEA), propylene glycol monomethyl ether (PGME), ethyl lactate (EL), and γ-butyrolactone are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

Further, as the component (S), a mixed solvent of the aforementioned mixed solvent of PGMEA and PGME with γ-butyrolactone is also preferable.

The amount of the component (S) used is not particularly limited, and is appropriately adjusted to a concentration which enables coating of a coating solution to a substrate, depending on the thickness of the coating film. In general, the component (S) is used in an amount such that the solid content of the resist composition becomes within the range from 2 to 20% by weight, and preferably from 5 to 15% by weight.

The positive resist composition of the present invention has the effect that a resist pattern with a reduced level of line edge roughness (LER) can be formed. The reasons for these have not yet been elucidated, but are presumed as follows.

The resin component used in the present invention has a structural unit (a1) containing an acetal-type acid dissociable, dissolution inhibiting group. Such an acid dissociable, dissolution inhibiting group can be dissociated with a low activation energy, as compared to, for example, a tertiary alkyl ester-type acid dissociable, dissolution inhibiting group. Therefore, the acid dissociable, dissolution inhibiting groups of the structural unit (a1) can be readily dissociated at exposed portions, and as a result, the difference (contrast) in the alkali solubility between exposed portions and unexposed portions becomes large. Accordingly, the degree of roughness in a boundary area between the exposed portions and unexposed portions is improved.

Moreover, the acid dissociable, dissolution inhibiting groups of the structural unit (a1) include a cyclopentyl group. By having a cyclopentyl group, the glass transition temperature of the resin component becomes lower compared to that of, for example, a conventional resin component having an acid dissociable, dissolution inhibiting group that includes a polycyclic group, a chain tertiary alkyl group, or the like. As a result, in the formation of a resist pattern, for example, the resist film easily softens by treatments such as post exposure baking (PEB), and thereby easily reducing fine unevenness on the resist pattern surface.

For the reasons described above, it is presumed that the positive resist composition of the present invention can form a resist pattern with a reduced level of LER.

Further, in the present invention, lithography properties such as the depth of focus (DOF) are also satisfactory.

The "DOF" is the range of depth of focus in which a resist pattern having a predetermined size within the range corresponding to the target size can be formed when the exposure focus is moved upwardly or downwardly with the same exposure dose, i.e., the range in which a resist pattern faithful to the mask pattern can be obtained. The larger DOF is, the more preferable.

Furthermore, in the present invention, an excellent exposure margin is achieved (that is, an exposure margin is large).

For example, when forming a line and space pattern, if a minimum exposure dose required to separate the lines completely (that is, a minimum exposure dose required to form spaces) is defined as [Eclr], an optimum exposure dose for forming the pattern having a line width:space width ratio of 1:1 is defined as [E1:1], and a minimum exposure dose which is enough to break the lines is defined as [Eb], there are great differences between [Eclr] and [E1:1] and between [E1:1] and [Eb] when the positive resist composition of the present invention is used.

As a result, both of 2 types of margins (that is, a Margin to separate [Ms] and a Margin to break [Mb]) determined by the following formula increase, thereby achieving an excellent exposure margin.

$$Ms=([E1:1]/[Eclr]-1)\times 100$$

$$Mb=([Eb]/[E1:1]-1)\times 100$$

Further, the exposure margin is satisfactory within a range of, for example, ±5% of the abovementioned [E1:1], as the absolute value for the dimensional variations per 1 mJ/cm$^2$ [nm/(mJ/cm$^2$)] decreases when forming L/S patterns with a target dimension.

<<Method of Forming a Resist Pattern>>

The method of forming a resist pattern according to the present invention includes: applying a positive resist composition of the present invention to a substrate to form a resist film on the substrate; subjecting the resist film to exposure; and developing the resist film to form a resist pattern.

More specifically, the method for forming a resist pattern according to the present invention can be performed, for example, as follows.

Firstly, the positive resist composition is applied onto a substrate such as a silicon wafer using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed to an ArF excimer laser beam through a desired mask pattern, followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide. In this manner, a resist pattern that is faithful to the mask pattern can be obtained.

A post bake step may be performed after the alkali developing. Further, an organic or inorganic anti-reflective film may also be provided between the substrate and the applied coating layer of the resist composition.

Further, the wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is particularly effective to ArF excimer laser.

EXAMPLES

As follows is a description of examples of the present invention, although the scope of the present invention is by no way limited by these examples.

The resins (A)-1 to (A)-3 used in Example 1 and Comparative Examples 1 and 2 were synthesized by respectively using the monomers (1) to (5) shown below.

[Chemical Formula 41]

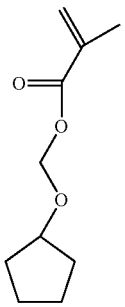
(1)

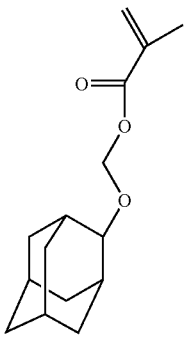
(2)

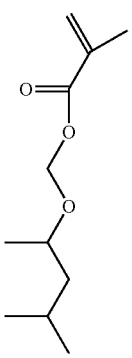
(3)

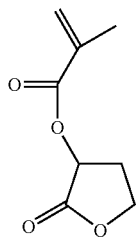
(4)

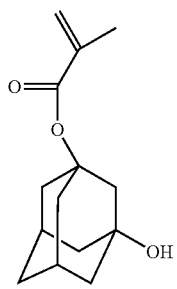
(5)

[Synthesis of Monomer (1)]

The monomer (1) was synthesized through the procedure described below.

[Chemical Formula 42]

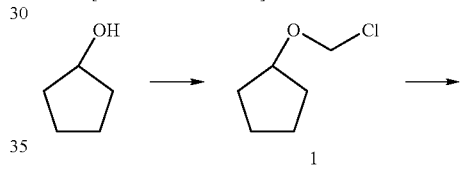

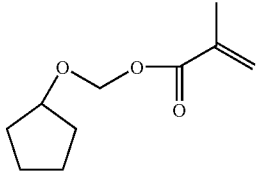

[Synthesis of Chloromethoxycyclopentane (Compound 1)]

25.92 g (300 mmol) of cyclopentanol, 11.71 g (390 mmol) of paraformaldehyde, and 200 ml of dry dichloromethane were added to a 500 mL eggplant shaped flask equipped with a stirrer and a nozzle for introducing hydrogen chloride gas, and the resulting dichloromethane solution was stirred while maintaining the temperature thereof at 30° C. in a water bath.

Then, at normal pressure, a hydrogen chloride gas generated by mixing 175.5 g of sodium chloride and 200 mL of concentrated sulfuric acid was blown into the above dichloromethane solution through the nozzle for 60 minutes.

After stirring the reaction mixture for 60 minutes, gas chromatographic analysis of reaction products was carried out. As a result, it was confirmed that cyclopentanol was completely consumed and chloromethoxycyclopentane (compound 1 in the above procedure diagram) was obtained with a selectivity of 99%.

The reaction products were transferred to a separatory funnel and separated into an organic layer and an aqueous layer. Crude reaction products were obtained by evaporating solvents from the organic layer through distillation under reduced pressure.

Further, chloromethoxycyclopentane (compound 1) was obtained with a selectivity of 83.1% (yield: 33.66 g; gas chromatographic purity: 97.6%) by subjecting the crude reaction products to distillation under reduced pressure.

[Synthesis of Cyclopentyloxy Methyl Methacrylate (Compound 2)]

After adding 29.61 g (220 mmol) of the chloromethoxycyclopentane (compound 1) obtained above and 59 mg of methoquinone and 200 mL of hexane as polymerization inhibitors to a 500 mL eggplant shaped flask equipped with a stirrer, a thermometer, and a dropping funnel, the resulting mixture liquid was cooled in an ice bath until the liquid temperature reached 2° C.

A colorless transparent solution was obtained in the flask at this stage.

Subsequently, 33.39 g (330 mmol) of triethylamine was added dropwise to the obtained solution using a dropping funnel, followed by the dropwise addition of 28.41 g (330 mmol) of methacrylic acid.

Since heat release was observed when adding methacrylic acid dropwise, the rate of dropwise addition was adjusted so as to achieve a liquid temperature of 15° C. or less.

The resulting reaction solution was a white turbid solution at this stage.

After the dropwise addition of methacrylic acid, sequential sampling was conducted while stirring the resulting reaction solution for 3 hours until chloromethoxycyclopentane (compound 1) was completely consumed, and the production of a target product was confirmed by gas chromatography.

100 mL of ice-cold water was then added to the reaction solution and the resulting mixture was stirred for 3 minutes. As a result, a white turbid reaction solution turned into a colorless transparent solution.

The obtained solution was transferred to a separatory funnel, and after separating an aqueous layer, the resultant was washed three times with 100 mL of an aqueous saturated sodium bicarbonate solution.

The resultant was further washed with 200 mL of an aqueous saturated sodium chloride solution, followed by drying with magnesium sulfate.

After removing magnesium sulfate through filtration and adding 6 mg of methoquinone as a polymerization inhibitor, cyclopentyloxy methyl methacrylate (compound 2 in the above procedure diagram) was obtained with a selectivity of 92.6% (molecular weight: 184.23; yield: 37.54 g; gas chromatographic purity: 97.5%).

(Spectral Data)
Nuclear magnetic resonance spectrum (solvent: chloroform-d) [JNM-ECA500 manufactured by JEOL Ltd.]

$^1$H-NMR (500 MHz): 1.47-1.80 (8H), 1.93 (3H), 4.18 (m, 1H), 5.36 (d, 2H), 5.59 (d, 1H), 6.14 (s, 1H)

$^{13}$C-NMR (126 MHz): 18.27, 23.37, 32.83, 82.07, 88.85, 126.10, 136.35, 166.94

GC-MS (E1) [GCMS-QP2010 manufactured by Shimadzu Corporation]

99 (22.03%), 98 (17.94%), 87 (12.66%), 69 (100%)

[Synthesis of Resin Component (A)]

This process is described in more detail using the synthesis of the resin (A)-1 as an example. Propylene glycol monomethyl ether acetate (PGMEA) was charged into a flask equipped with an inlet for nitrogen, a stirrer, a condenser and a thermometer in a nitrogen atmosphere, and the temperature of the water bath was elevated to 80° C. while stirring.

Subsequently, 2,2'-azobisisobutyronitrile (AIBN) as a polymerization initiator, PGMEA, and a monomer solution obtained by mixing so that the ratio of the monomers within the solution was monomer (1)/monomer (4)/monomer (5)=4/4/2 (molar ratio), were dropwise added into the flask using a dripping apparatus at a constant rate over 6 hours, and then the temperature was maintained at 80° C. for 1 hour. Then, the temperature of the reaction liquid was cooled to room temperature.

Subsequently, the resulting reaction liquid was dropwise added to methanol about 30 times in amount while stirring, to obtain a colorless precipitate. The obtained precipitate was subjected to filtration, and then the precipitate was washed in methanol in an amount about 30 times the amount of the monomers used in the polymerization. The resulting precipitate was subjected to filtration, followed by drying at 50° C. under reduced pressure for about 40 hours, thereby obtaining the resin (A)-1.

The resins (A)-2 and (A)-3 were synthesized in substantially the same manner as in the above method for synthesizing the resin (A)-1, except that monomers for deriving the structural units of the respective polymers were used in a predetermined molar ratio.

The obtained resins (A)-1 to (A)-3 are shown below.

The weight average molecular weight (Mw) and dispersity (Mw/Mn) of the resins (A)-1 to (A)-3 were determined respectively, by the polystyrene equivalent value as measured by gel permeation chromatography (GPC).

The thermal decomposition temperature (Td) and the glass transition temperature (Tg) of the resins (A)-1 to (A)-3 were measured, respectively. The Td value (° C.) was measured using a thermal analysis apparatus DSC6200 (product name) manufactured by Seiko Instruments, Inc. under conditions including the rate of temperature increase of 10° C./minute. The Tg value (° C.) was measured using a thermal analysis apparatus TG/DTA6200 (product name) manufactured by Seiko Instruments, Inc. under conditions including the rate of temperature increase of 10° C./minute.

Further, the compositional ratio indicating the percentage (mol %) of the respective structural units within the resins (A)-1 to (A)-3 was determined by carbon NMR (nuclear magnetic resonance spectrum). In the chemical formulas (A)-1 to (A)-3 showing the resin structures, each of the subscript numerals at the lower right of the respective structural units indicate the percentage (mol %) of the respective structural units within the resins.

[Chemical Formula 43]

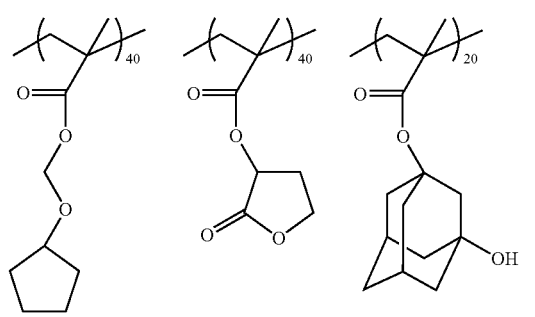

(Mw = 5,800, Mw/Mn = 2.21, Td/Tg = 198/152)

-continued

[Chemical Formula 44]

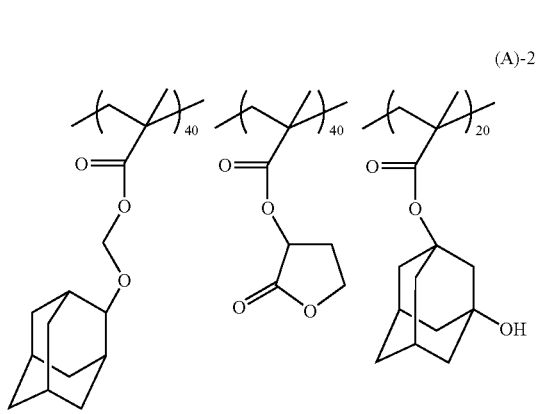

(Mw = 7,000, Mw/Mn = 2.16, Td/Tg = 237/188)

[Chemical Formula 45]

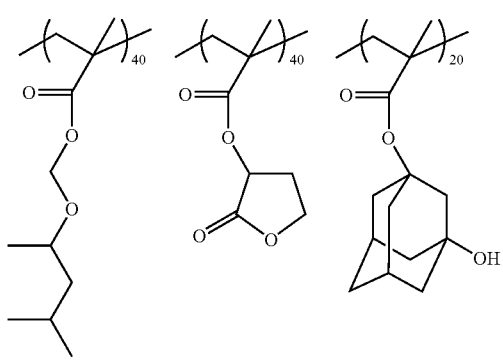

(Mw = 7,000, Mw/Mn = 2.13, Td/Tg = 211/164)

Examples 1, Comparative Examples 1 and 2

The components shown in Table 1 were mixed together and dissolved to obtain positive resist compositions.

TABLE 1

| | Component (A) | Component (B) | Component (D) | Component (E) | Component (S) | |
|---|---|---|---|---|---|---|
| Ex. 1 | (A)-1 [100] | (B)-1 [13.0] | (D)-1 [0.54] | (E)-1 [1.32] | (S)-1 [10] | (S)-2 [1,450] |
| Comp. Ex. 1 | (A)-2 [100] | (B)-1 [13.0] | (D)-1 [0.54] | (E)-1 [1.32] | (S)-1 [10] | (S)-2 [1,450] |
| Comp. Ex. 2 | (A)-3 [100] | (B)-1 [13.0] | (D)-1 [0.54] | (E)-1 [1.32] | (S)-1 [10] | (S)-2 [1,450] |

In Table 1, the reference characters indicate the following. Further, the values in brackets [ ] indicate the amount (in terms of parts by weight) of the component added.

(B)-1: an acid generator represented by chemical formula (B)-1 shown below

[Chemical Formula 46]

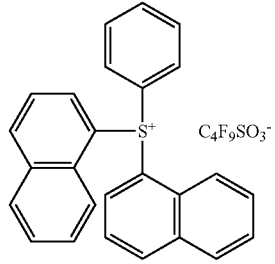

(D)-1: tri-n-pentylamine
(E)-1: salicylic acid
(S)-1: γ-butyrolactone
(S)-2: a mixed solvent of PGMEA/PGME=6/4 (weight ratio)

Line and space resist patterns were formed using the obtained positive resist composition, and the following evaluations on the line edge roughness (LER), the depth of focus (DOF), and the exposure margin were performed, respectively.

<<Formation of a Resist Pattern>>

A commercially available organic anti-reflection film composition was applied onto an 8-inch silicon wafer using a spinner, and the composition was then baked at 185° C. for 60 seconds, thereby forming an organic anti-reflection film having a film thickness of 38 nm.

Then, the positive resist composition obtained above was applied onto the organic anti-reflection film using a spinner, and was then prebaked (PAB) on a hotplate at a temperature indicated in Table 2 for 60 seconds and dried, thereby forming a resist film having a film thickness of 130 nm.

Subsequently, the resist film was selectively irradiated with an ArF excimer laser (193 nm) through a mask pattern (6% half tone mask), using an ArF exposure apparatus NSR-S306C (manufactured by Nikon Corporation, NA (numerical aperture)=0.78, ⅔ annular illumination).

Thereafter, a post exposure bake (PEB) treatment was conducted at the temperature indicated in Table 2 for 60 seconds, followed by puddle development for 30 seconds at 23° C. in a 2.38% by weight aqueous solution of tetramethylammonium hydroxide (TMAH). Then, the resist was washed for 20 seconds with pure water, followed by drying by shaking. Then the films were further heated and dried at 100° C. for 60 seconds, thereby forming line and space resist patterns (hereafter referred to as L/S patterns) with a line width of 85 nm.

[Evaluation of Sensitivity]

The exposure dose (sensitivity) (unit: mJ/cm$^2$) with which a 85 nm L/S pattern having a line width:space width ratio of 1:1 was formed was determined as [E1:1]. The results are shown in Table 2.

[Evaluation of Line Edge Roughness (LER)]

For the 85 nm L/S pattern (1:1) obtained at the above [E1:1] value, the 3σ value was determined, which is a measure of the LER.

The "3σ value" is determined by measuring the width of the resist patterns formed respectively with the abovementioned positive resist composition using a measuring SEM (product name: S-9360, manufactured by Hitachi, Ltd.) at a measurement voltage of 300 V, and calculating the value (namely, 3σ) of 3 times the standard deviation (namely, σ) from these measurement results.

The smaller this 3σ value is, the lower the level of roughness of the side walls of a line pattern, indicating a resist pattern with a uniform width. The results are shown in Table 2.

[Evaluation of Depth of Focus (DOF)]

In the above [E1:1] value, the focus was appropriately shifted up and down, and the depth of focus (DOF) (nm) was determined within the range where the size change of the above L/S pattern was 85 nm±10% (that is, 76.5 to 93.5 nm), which was the target dimension. The results are shown in Table 2.

[Evaluation of Exposure Margin]

[Eclr] and [Eb] were determined as a minimum exposure dose required to separate the lines and a minimum exposure dose which is enough to deform the shape of the formed lines, respectively, when forming the 85 nm L/S pattern in substantially the same procedure as described in the above paragraph "Formation of a resist pattern" by gradually increasing the exposure dose.

The Ms (Margin to separate) and Mb (Margin to break) values, which are for evaluating exposure margin, were determined respectively by the following formula.

$$Ms=([E1:1]/[Eclr]-1)\times100$$

$$Mb=([Eb]/[E1:1]-1)\times100$$

Further, within a range of ±5% of the abovementioned [E1:1], the dimensional variations per 1 mJ/cm² [nm/(mJ/cm²)] when forming 85 nm L/S patterns were determined.

It should be noted here that the larger "Ms" or "Mb" values, or the smaller the absolute value for the "dimensional variations", the more favorable the exposure margin of the pattern becomes.

The values of [Eclr], [E1:1], [Eb], [Ms], [Mb], and dimensional variations for each of the obtained patterns are shown in Table 2. The term "NG" found in Table 2 indicates that the measurement was not possible.

TABLE 2

| | PAB (° C.) | PEB (° C.) | LER (nm) | DOF (μm) | Eclr (mJ/cm²) | E1:1 (mJ/cm²) | Eb (mJ/cm²) | Ms (%) | Mb (%) | Dimensional variations [nm/(mJ/cm²)] |
|---|---|---|---|---|---|---|---|---|---|---|
| Ex. 1 | 80 | 80 | 7.2 | 0.4 | 44 | 48 | 56 | 9 | 17 | −4.5 |
| Comp. Ex. 1 | 110 | 110 | 9.1 | 0.4 | 36 | 38 | 44 | 6 | 16 | −7.1 |
| Comp. Ex. 2 | 80 | 80 | NG | NG | NG | NG | NG | NG | NG | NG |

As is apparent from the results shown in Table 2, it was confirmed that the resist composition of Example 1 according to the present invention was capable of forming resist patterns with a reduced level of LER, since the resist pattern formed by using the resist composition of Example 1 had a lower LER value, as compared to the resist pattern formed by using the resist composition of Comparative Example 1.

Further, it was confirmed that the DOF characteristics in Example 1 according to the present invention were comparable to those in Comparative Example 1 and were satisfactory.

Furthermore, it was confirmed that the exposure margin in Example 1 was also satisfactory, since the larger Ms and Mb values as well as the smaller absolute value for dimensional variations were achieved compared to those obtained in Comparative Example 1.

No L/S patterns could be formed in Comparative Example 2.

INDUSTRIAL APPLICABILITY

According to the present invention, there are provided a positive resist composition which is capable of forming a resist pattern with a reduced level of LER, and a method of forming a resist pattern. Therefore, the present invention is extremely useful in industry.

The invention claimed is:

1. A positive resist composition comprising a resin component (A) which exhibits increased alkali solubility under action of acid and an acid-generator component (B) which generates acid upon exposure, said resin component (A) comprising a structural unit (a1) represented by general formula (I) shown below:

[Chemical Formula 1]

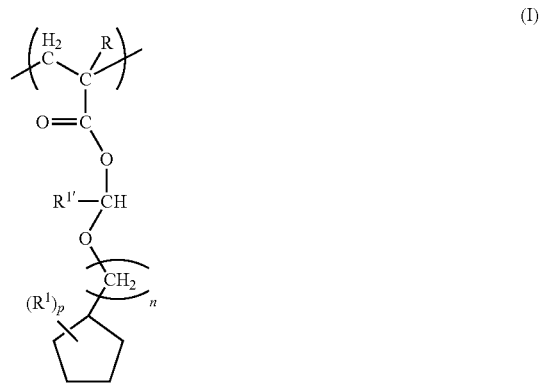

wherein R represents a hydrogen atom, a halogen atom, a lower alkyl group or a halogenated lower alkyl group; $R^{1'}$ represents a hydrogen atom or a lower alkyl group; n represents an integer of 0 to 3; $R^1$ represents a lower alkyl group, a fluorine atom, or a fluorinated lower alkyl group; and p represents an integer of 0 to 2.

2. The positive resist composition according to claim 1, wherein said resin component (A) further comprises a structural unit (a2) derived from an acrylate ester having a lactone-containing cyclic group.

3. The positive resist composition according to claim 1, wherein said resin component (A) further comprises a structural unit (a3) derived from an acrylate ester having a polar group-containing aliphatic hydrocarbon group.

4. The positive resist composition according to claim 2, wherein said resin component (A) further comprises a structural unit (a3) derived from an acrylate ester having a polar group-containing aliphatic hydrocarbon group.

5. The positive resist composition according to claim 1, which further comprises a nitrogen-containing organic compound (D).

6. A method of forming a resist pattern, comprising:
applying a positive resist composition of any one of claims 1 to 5 to a substrate to form a resist film on the substrate; subjecting said resist film to exposure; and
developing said resist film to form a resist pattern.

* * * * *

UNITED STATES PATENT AND TRADEMARK OFFICE
CERTIFICATE OF CORRECTION

PATENT NO.          : 7,919,227 B2
APPLICATION NO.     : 12/440447
DATED               : April 5, 2011
INVENTOR(S)         : Yohei Kinoshita, Takeshi Iwai and Toshiyuki Ogata It is certified that error appears in the above-identified patent and that said Letters Patent is hereby corrected as shown below:

At Column 19, Line 11, Change "norbonyl" to --norbornyl--.

At Column 19, Line 13-14, Change "norbonyl" to --norbornyl--.

At Column 19, Line 14, Change "norbonyl" to --norbornyl--.

At Column 19, Line 19, Change "norbonyl" to --norbornyl--.

At Column 68, Line 15 (Approx.), Change

" 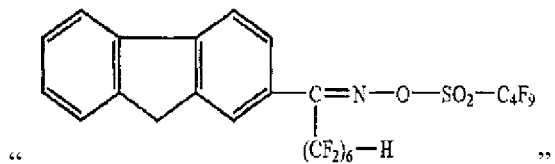 "

to

-- 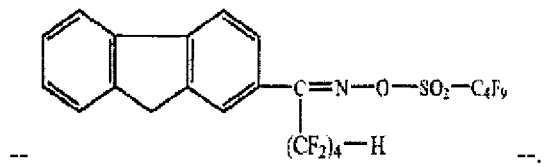 --.

Signed and Sealed this
Fourth Day of October, 2011

David J. Kappos
*Director of the United States Patent and Trademark Office*